(12) United States Patent
Karshtedt et al.

(10) Patent No.: US 8,846,507 B2
(45) Date of Patent: *Sep. 30, 2014

(54) SILICON POLYMERS, METHODS OF POLYMERIZING SILICON COMPOUNDS, AND METHODS OF FORMING THIN FILMS FROM SUCH SILICON POLYMERS

(71) Applicants: Dmitry Karshtedt, San Francisco, CA (US); Joerg Rockenberger, San Jose, CA (US); Fabio Zurcher, Brisbane, CA (US); Brent Ridley, San Carlos, CA (US); Erik Scher, San Francisco, CA (US)

(72) Inventors: Dmitry Karshtedt, San Francisco, CA (US); Joerg Rockenberger, San Jose, CA (US); Fabio Zurcher, Brisbane, CA (US); Brent Ridley, San Carlos, CA (US); Erik Scher, San Francisco, CA (US)

(73) Assignee: Thin Film Electronics ASA, Oslo (NO)

( * ) Notice: Subject to any disclaimer, the term of this patent is extended or adjusted under 35 U.S.C. 154(b) by 0 days.

This patent is subject to a terminal disclaimer.

(21) Appl. No.: 13/897,296

(22) Filed: May 17, 2013

(65) Prior Publication Data
US 2013/0252407 A1  Sep. 26, 2013

Related U.S. Application Data

(63) Continuation of application No. 13/299,318, filed on Nov. 17, 2011, now Pat. No. 8,461,284, which is a continuation of application No. 11/867,587, filed on Oct. 4, 2007, now Pat. No. 8,092,867.

(60) Provisional application No. 60/850,094, filed on Oct. 6, 2006, provisional application No. 60/905,403, filed on Mar. 5, 2007.

(51) Int. Cl.
*H01L 21/02* (2006.01)
*C08G 77/00* (2006.01)
*C07F 7/02* (2006.01)
*C09D 183/16* (2006.01)
*C08G 77/60* (2006.01)
*H01L 27/12* (2006.01)

(52) U.S. Cl.
CPC ....... *H01L 21/02628* (2013.01); *H01L 27/1214* (2013.01); *C09D 183/16* (2013.01); *C08G 77/60* (2013.01); *H01L 21/02282* (2013.01)
USPC ........... 438/502; 423/347; 252/500; 438/790; 528/31; 528/33

(58) Field of Classification Search
None
See application file for complete search history.

(56) References Cited

U.S. PATENT DOCUMENTS 4,052,430 A  10/1977  Yajima et al.
4,276,424 A   6/1981  Peterson, Jr. et al.
(Continued)

FOREIGN PATENT DOCUMENTS

CN  1297578  5/2001
CN  1407018  4/2003
(Continued)

OTHER PUBLICATIONS

Taiwanese Office Action dated Feb. 21, 2012; Taiwanese Patent Application No. 096137419; 11 pages total; Taiwan Intellectual Property Office, Taiwan.
(Continued)

*Primary Examiner* — Robert S Loewe
(74) *Attorney, Agent, or Firm* — Andrew D. Fortney; Murabito Hao & Barnes LLP

(57) ABSTRACT

Compositions and methods for controlled polymerization and/or oligomerization of hydrosilanes compounds including those of the general formulae $Si_nH_{2n}$ and $Si_nH_{2n+2}$ as well as alkyl- and arylsilanes, to produce soluble silicon polymers as a precursor to silicon films having low carbon content.

22 Claims, 13 Drawing Sheets

(56) References Cited

U.S. PATENT DOCUMENTS

| | | |
|---|---|---|
| 4,310,482 A | 1/1982 | Baney |
| 4,537,942 A | 8/1985 | Brown-Wensley et al. |
| 4,554,180 A | 11/1985 | Hirooka |
| 4,611,035 A | 9/1986 | Brown-Wensley et al. |
| 4,683,145 A | 7/1987 | Nishimura et al. |
| 4,683,146 A | 7/1987 | Hirai et al. |
| 4,704,444 A | 11/1987 | Brown-Wensley et al. |
| 4,726,963 A | 2/1988 | Ishihara et al. |
| 4,759,947 A | 7/1988 | Ishihara et al. |
| 4,820,788 A | 4/1989 | Zeigler |
| 4,822,703 A | 4/1989 | Badesha et al. |
| 4,830,890 A | 5/1989 | Kanai |
| 4,835,005 A | 5/1989 | Hirooka et al. |
| 4,841,083 A | 6/1989 | Nagai et al. |
| 4,900,861 A | 2/1990 | Yokoyama et al. |
| 4,992,520 A | 2/1991 | Zeigler |
| 5,153,295 A | 10/1992 | Whitmarsh et al. |
| 5,204,380 A | 4/1993 | Seyferth et al. |
| 5,358,987 A | 10/1994 | Kanai et al. |
| 5,700,400 A | 12/1997 | Ikai et al. |
| 5,798,428 A | 8/1998 | Schwab et al. |
| 5,866,471 A | 2/1999 | Beppu et al. |
| 5,942,637 A | 8/1999 | Boudjouk et al. |
| 6,005,036 A | 12/1999 | Carrozza et al. |
| 6,140,448 A | 10/2000 | Choi et al. |
| 6,174,982 B1 | 1/2001 | Nishida et al. |
| 6,503,570 B2 | 1/2003 | Matsuki et al. |
| 6,514,801 B1 | 2/2003 | Yudasaka et al. |
| 6,517,911 B1 | 2/2003 | Matsuki |
| 6,518,087 B1 | 2/2003 | Furusawa et al. |
| 6,527,847 B1 | 3/2003 | Matsuki |
| 6,541,354 B1 | 4/2003 | Shimoda et al. |
| 6,610,872 B1 | 8/2003 | Choi et al. |
| 6,767,775 B1 | 7/2004 | Yudasaka et al. |
| 6,884,700 B2 | 4/2005 | Aoki et al. |
| 6,908,796 B2 | 6/2005 | Furusawa |
| 7,067,069 B2 | 6/2006 | Shiho et al. |
| 7,078,276 B1 | 7/2006 | Zurcher et al. |
| 7,223,802 B2 | 5/2007 | Aoki et al. |
| 7,314,513 B1 | 1/2008 | Zurcher et al. |
| 7,485,691 B1 | 2/2009 | Guo et al. |
| 7,491,782 B1 | 2/2009 | Guo et al. |
| 7,498,015 B1 | 3/2009 | Kunze et al. |
| 7,674,926 B1 | 3/2010 | Guo et al. |
| 7,951,892 B1 | 5/2011 | Guo et al. |
| 8,057,865 B1 | 11/2011 | Guo et al. |
| 2001/0021760 A1 | 9/2001 | Matsuki et al. |
| 2003/0045632 A1 | 3/2003 | Shiho et al. |
| 2003/0087110 A1 | 5/2003 | Furusawa et al. |
| 2003/0148024 A1 | 8/2003 | Kodas et al. |
| 2003/0229190 A1 | 12/2003 | Aoki et al. |
| 2004/0029364 A1 | 2/2004 | Aoki et al. |
| 2004/0248429 A1 | 12/2004 | Aoki |
| 2005/0176183 A1 | 8/2005 | Aoki |
| 2005/0181566 A1 | 8/2005 | Machida et al. |
| 2006/0159859 A1 | 7/2006 | Iwasawa |
| 2006/0185712 A1 | 8/2006 | Shiho et al. |
| 2006/0198966 A1 | 9/2006 | Kaino et al. |
| 2007/0190265 A1 | 8/2007 | Aoki et al. |
| 2009/0215920 A1 | 8/2009 | Iwasawa et al. |

FOREIGN PATENT DOCUMENTS

| | | |
|---|---|---|
| DE | 3122992 | 2/1982 |
| EP | 1 085 560 A1 | 3/2001 |
| EP | 1 085 579 A1 | 3/2001 |
| EP | 1 087 428 A1 | 3/2001 |
| EP | 1 087 433 A1 | 3/2001 |
| EP | 1 113 502 A1 | 7/2001 |
| EP | 0 902 030 B1 | 10/2002 |
| EP | 1 284 306 A2 | 2/2003 |
| EP | 1 357 154 A1 | 10/2003 |
| GB | 2 077 710 B | 12/1981 |
| JP | 57-27915 | 2/1982 |
| JP | 60-242612 | 12/1985 |
| JP | 2-184513 | 7/1990 |
| JP | 4-334551 | 11/1992 |
| JP | 5-230219 | 9/1993 |
| JP | 6-191821 | 7/1994 |
| JP | 7-267621 | 10/1995 |
| JP | 9-45922 | 2/1997 |
| JP | 9-237927 | 9/1997 |
| JP | 11-79727 | 3/1999 |
| JP | 11-171528 | 6/1999 |
| JP | 2000-7317 | 1/2000 |
| JP | 200031066 | 1/2000 |
| JP | 2002203794 | 7/2002 |
| JP | 2002-246384 | 8/2002 |
| JP | 2003-55556 | 2/2003 |
| JP | 2003-92297 | 3/2003 |
| JP | 2003-124486 | 4/2003 |
| JP | 2003-313299 | 11/2003 |
| JP | 2003-318120 | 11/2003 |
| JP | 2004-311945 | 11/2004 |
| JP | 2005-219981 | 8/2005 |
| TW | 200305575 A | 11/2003 |
| TW | 200512158 A | 4/2005 |
| WO | 00/59022 | 10/2000 |
| WO | 0059014 | 10/2000 |
| WO | 0059041 | 10/2000 |
| WO | 2004/110929 | 12/2004 |

OTHER PUBLICATIONS

Haruo Iwasawa, Doahai Wang, Yasuo Matsuki and Hitoshi Kato; "Silane Polymer and Method for Forming Silicon Film"; Taiwan Publication No. TW 200512158 A; Taiwan Publication Date: Apr. 1, 2005; Taiwan Patent Abstract, Taiwan Intellectual Property Office, People's Republic of China, Taiwan.

Takashi Aoki, Masahiro Furusawa, Yasuo Matsuki, Haruo Iwasawa and Yasumasa Takeuchi; "High Order Silane Composition, and Method of Forming Silicon Film Using the Composition"; Taiwan Publication No. TW 200305575 A; Taiwan Publication Date: Nov. 1, 2003; Taiwan Patent Abstract, Taiwan Intellectual Property Office, People's Republic of China, Taiwan.

Qingzheng Wang and Joyce Y. Corey; Dehydrocoupling Reactions of Hydrosilanes with Group 4 Metallocenes Cp2MY2 (M=Ti, Zr, Hf,; Y=F, OPh, NMe2); Can. J. Chem., vol. 78, 2000; pp. 1434-1440; 2000 NRC Canada.

Uwe Herzog & Robert West; Heterosubstituted Polysilanes (5 pages); Macromolecules 1999, 32, 2210-2214; American Chemical Society, Mar. 9, 1999.

Vladimir K. Dioumaev and John F. Harrod; A Systematic Analysis of the Structure-Reactivity Trends for Some 'Cation-Like' Early Transition Metal Cataylsts for Dehydropolymerization of Silanes; Journal of Organometallic Chemistry, 521 (1996) 133-143; Elsevier Science S.A..

T. Don Tilley; The Coordination Polymerization of Silanes to Polysilanes by a "σ-Bond Metathesis" Mechanism. Implications for Linear Chain Growth; Acc. Chem. Res.; pp. 22-29; vol. 26, No. 1, 1993; American Chemical Society.

Karl Hassler, Ulrike Katzenbeisser and Barbara Reiter; Verbesserte Synthesen von Phenyltrisilanen; Journal of Organometallic Chemistry; 1994; pp. 193-196; vol. 479; Elsevier Science S.A.

F. Feher, P. Plichta and R. Guillery; Beitrage zur Chemie des Siliziums und Germaniums XIV uber die Umsetzung von Kaliumsilyl mit Phenylbromsilanen und Phenylbromgermanen Darstellung von Phenylsilylkalium; Tetrahedron Letters; Oct. 6, 1970; No. 51; pp. 4443-4447; Pergamon Press, Great Britain.

F. Feher, P. Plichta and R. Guillery; Beitrage zur Chemie des Siliciums und Germaniums XIII uber die Darstellung Neuer Phenylsilane; Tetrahedron Letters; Jun. 10, 1970; No. 33; pp. 2889-2893; Pergamon Press, Great Britain.

Karl Hassler and Wolfgang Koll; Synthese und Eigenschaften chlorierter und bromierter Aryltrisilane und Aryltetrasilane; Journal of Organometallic Chemistry; 1997; vol. 538; pp. 135-143; Elsevier Science S.A., Austria.

R. D. Miller and R. Sooriyakumaran; Soluble Alkyl Substituted Polygermanes: Thermochromic Behavior; Journal of Polymer Sci-

(56) References Cited

OTHER PUBLICATIONS ence: Part A: Polymer Chemistry; 1987; pp. 111-125; vol. 25; John Wiley & Sons, Inc., United States.
R. D. Miller and P.K. Jenkner; Sacrificial Additives in the Wurtz Synthesis of Polysilanes; Macromolecules; 1994; pp. 5921-5923; vol. 27; American Chemical Society, United States.
Robert West; The Polysilane High Polymers; Journal of Organometallic Chemistry; 1986; pp. 327-346; vol. 300; Elsevier Sequoia S.A., The Netherlands.
Robin Richter, Gerhard Roewer, Uwe Bohme, Kathleen Busch, Florence Babonneau, Hans Peter Martin and Eberhard Muller; Organosilicon Polymers-Synthesis, Architecture, Reactivity and Applications; Applied Organometallic Chemistry; 1997; pp. 71-106; vol. 11; John Wiley & Sons, Ltd., United States.
Wenzhuo Guo et al; Heterocyclic Semiconductor Precursor Compounds, Compositions Containing the Same, and Methods of Making such Compounds and Compositions; U.S. Appl. No. 10/950,373, filed in the USPTO on Sep. 24, 2004.
E. Hengge and H. Firgo; An Electrochemical Method for the Synthesis of Silicon-Silicon Bonds; Journal of Organometallic Chemistry; 1981; pp. 155-161; vol. 212; Elsevier Sequoia S.A., The Netherlands.
Robert D. Miller and Josef Michl; Polysilane High Polymers; Chemical Reviews; vol. 89, No. 6; pp. 1359-1410; 1989; American Chemical Society.
R. D. Miller, D. Thompson, R. Sooriyakumaran and G. N. Fickes; The Synthesis of Soluble, Substituted Silane High Polymers by Wurtz Coupling Techniques; Journal of Polymer Science: Part A: Polymer Chemistry; 1991; pp. 813-824; vol. 29; John Wiley & Sons, Inc., United States.
Tatsuya Shono, Shigenori Kashimura and Hiroaki Murase; Electroreductive Synthesis of Polygermane and Germane—Silane Copolymer; J. Chem. Soc., Chem. Commun., 1992; 2 pages; Dept. of Synthetic Chemistry, Kyoto, Japan and Advanced Technology Center, Osaka, Japan.
Kohei Tamao, Atsushi Kawachi and Yoshihiko Ito; Coupling of (Amino)alkylchlorosilanes with Lithium: New Access to Symmetrical Di- and Tetrafunctional Alkyldisilanes; Organometallics; 1993; pp. 580-582; vol. 12, No. 2; American Chemical Society, United States.
Wolfram Uhlig; "Synthesis, functionalization, and cross-linking reactions of organosilicon polymers using silyl triflate intermediates"; Progress in Polymer Science; 2002; 255-305; vol. 27.
Wolfram Uhlig; "Tailor-made synthesis of functional substituted oligo- and polysilanes from silyl triflates and (aminosilyl) lithium compounds"; Journal of Organometallic Chemistry; 2003; 70-78; vol. 685.
PCT International Preliminary Report on Patentability dated Mar. 3, 2009; International Application No. PCT/US2007/021403, International filing date Oct. 4, 2007; 6 pages; International Preliminary Examining Authority, US Receiving Office.
Tatsuya Shimoda et al.; "Solution-processed silicon films and transistors"; Nature; vol. 440; Apr. 6, 2006; pp. 783-786; Nature Publishing Group 2006; United States.
Von F. Feher, D. Schinkitz and J. Schaaf; "Ein Verfahren zur Darstellung Hoherer Silane"; Beitrage zur Chemie des Siliciums und Germaniums; vol. 383, No. 3, Jul. 1971, pp. 303-313; XP002635691, Weinheim, DE.
Supplementary European Search Report and Written Opinion; European Application No. 07839301.4; Dated May 25, 2011; 12 pages; European Patent Office; Munich, Germany.
Masahiro Furusawa, Satoru Miyashita, Kazuo Yudasaka, Tatsuya Shimoda, Yasuaki Yokoyama, Yasuo Matsuki and Yasumasa Takeuchi; "Formation Method of Silicon Thin Film"; Publication No. 2002203794 A; Publicaton Date Jul. 19, 2002; Patent Abstracts of Japan; Japanese Patent Office, Japan.
Tsutomu Takadera, Keiichi Fukuyama, Akira Sakawaki, Kotaro Yano and Yutaka Kitsuno; "Method for Forming Silicon Film and Manufacture of Solar Battery"; 2 pages; Publication No. 2000031066 A; Publication Date Jan. 28, 2000; Patent Abstracts of Japan; Japanese Patent Office, Japan.
Philip Raymond Boudjouk, Beon-Kyu Kim, Michael P. Remington and Bhanu Chauhan; "Tetradecachlorocyclohexasilane-Dianion-Containing Compound"; Publication No. 11171528 A; Publication Date Jun. 29, 1999; Patent Abstracts of Japan; Japanese Patent Office, Japan.
Yutaka Kitsuno, Kotaro Yano, Akira Sakawaki, and Keiji Kawasaki; "Method for Forming Poly Crystal Silicon Film"; Publication No. 09045922 A; Publication Date Feb. 14, 1997; Patent Abstracts of Japan; Japanese Patent Office, Japan.
Kotaro Yano, Yutaka Kitsuno, Akira Sakawaki, and Keiji Kawasaki; "Formation of Silicon Membrane"; Publication No. 07267621 A; Publication Date Oct. 17, 1995; Patent Abstracts of Japan; Japanese Patent Office, Japan.
Kotaro Yano, Yutaka Kitsuno, Shoichi Tazawa, and Keiji Kawasaki; "Higher Order Silane Containing Solution for Forming Silicon Film"; Publication No. 06191821 A; Publication Date Jul. 12, 1994; Patent Abstracts of Japan; Japanese Patent Office, Japan.
Yukio Nishimura, Hiroshi Matsuda, Masahiro Haruta, Yutaka Hirai, Takeshi Eguchi and Takashi Katagiri; "Deposition Film Forming Method"; Publication No. 60242612 A; Publication Date Dec. 2, 1985; Patent Abstracts of Japan; Japanese Patent Office, Japan.
Phillip John, Michael John Tricker and Michael John Kingston Thomas; "Process for Preparing Polysilane"; esp@cenet; Abstract of Publication No. DE3122992; Publication Date: Feb. 4, 1982; esp@cenet Database—Worldwide, http://v3.espacenet.com/textdoc?DB=EPODOC&IDX=DE3122992&F=0.
Tamejirou Hiyama and Yasuo Hatanaka; "Production of Alpha, Omega-Dihydropolysilane"; Patent Abstracts of Japan; 10 pages; Publication No. 05-230219; Publication Date: Sep. 7, 1993; Japan Patent Office, Japan.
Ryuji Sato, Yasuo Nomura, Masashi Nakajima, and Yoshiharu Okumura; "Polymerization Catalyst of Hydrosilane"; Patent Abstracts of Japan; Publication No. 04-334551; Publication Date: Nov. 20, 1992; Japan Patent Office, Japan.
Takashi Aoki; "Method of Preparing Higher Order Silane Solution, Method of Forming Silicon Film, Silicon Film, Thin Film Transistor (TFT), and Electro-Optic Device"; Patent Abstracts of Japan; Publication No. 2005-219981; Publication Date: Aug. 18, 2005; Japan Patent Office; Japan.
Tatsuro Beppu, Shuji Hayase, Toshiro Hiraoka, Atsushi Kamata and Kenji Sano; "Semiconductor Film Forming Method and Solar Cell Manufacturing Method"; 2 pages; Patent Abstracts of Japan; Publication No. 09-237927; Publication Date: Sep. 9, 1997; Japan Patent Office; Japan.
Shio Kooji and Katoo Nichika; "Silane Composition, Silicon Film Forming Method and Manufacture of Solar Cells"; English Abstract of Chinese Patent Publication No. CN1407018; Publication Date: Apr. 2, 2003; esp@cenet database—Worldwide.
Matsuki Yasuo; "Process for Formation of Silicon Oxide Films"; English Abstract of Chinese Patent Publication No. CN1297578; Publication Date: May 30, 2001; esp@cenet database—Worldwide.
Takashi Aoki; "Method of Manufacturing Transistor, Electro-Optical Device and Electronic Apparatus"; English Abstract of Japanese Patent Publication No. JP2004311945; Publication Date: Nov. 4, 2004; esp@cenet database—Worldwide.
Takashi Aoki, Masahiro Furusawa and Kazuo Yudasaka; "Method of Manufacturing Device, Device and Electronic Apparatus"; English Abstract of Japanese Patent Publication No. JP2003318120; Publication Date: Nov. 7, 2003; esp@cenet database—Worldwide.
Takashi Aoki, Masahiro Furusawa, Kazuo Yudasaka, Haruo Iwasawa and Yasumasa Takeuchi; "Higher Order Silane Composition and Process for Forming Silicon Film Using the Same"; English Abstract of Japanese Patent Publication No. JP2003313299; Publication Date: Nov. 6, 2003; esp@cenet database—Worldwide.
Kouji Shiho and Hitoshi Kato; "Production Method of Solar Cell and Composition Therefor"; English Abstract of Japanese Patent Publication No. JP2003124486; Publication Date: Apr. 25, 2003; esp@cenet database—Worldwide.
Hitoshi Kato and Kouji Shiho; "Forming Method for Silicon Oxide Film and Composition for Formation"; English Abstract of Japanese Patent Publication No. JP2003092297; Publication Date: Mar. 28, 2003; esp@cenet database—Worldwid.

(56) References Cited

OTHER PUBLICATIONS

Kouji Shiho and Hitoshi Kato; "Method for Forming Silicon Film or Silicon Oxide Film and Composition for Them"; English Abstract of Japanese Patent Publication No. JP2003055556; Publication Date: Feb. 26, 2003; esp@cenet database—Worldwide.

Kouji Shiho and Hitoshi Kato; "Method of Forming Silicon Oxide Film and Composition Used for Forming the Same"; English Abstract of Japanese Patent Publication No. JP2002246384; Publication Date: Aug. 30, 2002; esp@cenet database—Worldwide.

Keiichi Fukuyama, Tsutomu Takadera and Masabumi Shimizu; "Formation of Silicon Film"; English Abstract of Japanese Patent Publication No. JP2000007317; Publication Date: Jan. 11, 2000; esp@cenet database—Worldwide.

Jiyon Fuiritsupu, Jiyon Toritsukaa Maikeru and Jiyon Kingusuton Tooma Maikeru; "Synthesis of Polysilane"; English Abstract of Japanese Patent Publication No. JP57027915; Publication Date: Feb. 15, 1982; esp@cenet database—Worldwide.

Takashi Ouchida; "Formation of Silicon Film"; English Abstract of Japanese Patent Publication No. JP11079727; Publication Date: Mar. 23, 1999; esp@cenet database—Worldwide.

Haruo Iwasawa, Daohai Wang, Yasuo Matsuki and Hitoshi Kato; "Silane Polymer and Method for Forming Silicon Film"; English Abstract of PCT Patent Publication No. WO2004110929; Publication Date: Dec. 23, 2004; esp@cenet database—Worldwide.

Yasuo Matsuki; "Process for the Formation of Silicon Oxide Films"; English Abstract of PCT Patent Publication No. WO0059022; Publication Date: Oct. 5, 2000; esp@cenet database—Worldwide.

Okumura Yoshiharu, Takatsuna Kazutoshi, Yagihashi Yusuke; "Production of Disilane and Trisilane"; esp@cenet; Publication Number: JP2-184513 A; Publication Date: Jul. 19, 1990; esp@cenet Database—Worldwide; http://worldwide.espacenet.com/publicationDetails/biblio?DB=EPODOC&adjacent=true . . .

FIG. 12

SIMS Analysis: Polysilane film from UV polymerization of c-Si$_5$ Monomer

| Thickness [nm] | C [%] | H [%] | O [%] | N [ppm] | Na [ppm] | Al [ppm] | Mg [ppm] | K [ppm] |
|---|---|---|---|---|---|---|---|---|
| 80 | 0.03 | 11.7 | 0.01 | 11 | 0.006 | 0.004 | 0.003 | 0.006 |

SIMS Analysis: Polysilane film from Rh-Catalyzed Poly(c-Si$_5$)

| Thickness [nm] | C [%] | H [%] | O [%] | N [ppm] | Na [ppm] | Al [ppm] | Mg [ppm] | K [ppm] |
|---|---|---|---|---|---|---|---|---|
| 83 | 0.03 | 11.62 | 0.01 | 5 | 0.005 | 0.004 | 0.006 | 0.002 |

SIMS Data Including Rh Content – Representative Poly-Si$_5$ Batch

| Thickness [nm] | C [%] | H [%] | O [%] | N [ppm] | Na [ppm] | Al [ppm] | Mg [ppm] | K [ppm] | Rh [ppm] |
|---|---|---|---|---|---|---|---|---|---|
| 64 | 0.04 | 13.06 | 0.04 | 10 | 0.003 | 0.004 | 0.002 | 0.003 | 0.016 |

SILICON POLYMERS, METHODS OF POLYMERIZING SILICON COMPOUNDS, AND METHODS OF FORMING THIN FILMS FROM SUCH SILICON POLYMERS

RELATED APPLICATIONS

This application is a continuation of U.S. patent application Ser. No. 13/299,318, filed Nov. 17, 2011, which is a continuation of U.S. patent application Ser. No. 11/867,587, filed Oct. 4, 2007, now U.S. Pat. No. 8,092,867, which claims the benefit of U.S. Provisional Application No. 60/850,094, filed Oct. 6, 2006, and U.S. Provisional Application No. 60/905,403, filed Mar. 5, 2007, all of which are incorporated herein by reference in their entireties.

FIELD OF THE INVENTION

The present invention relates to poly- and/or oligosilane compositions, methods for the oligomerization and/or polymerization of hydro(aryl)silanes, methods of forming a thin silicon-containing film from such poly- and/or oligosilanes, thin silicon-containing films formed by such methods and from such poly- and/or oligosilanes, and structures containing such thin films.

BACKGROUND OF THE INVENTION

Cyclopentasilane is a known compound that is liquid at ambient temperatures and can form silicon films with useful photovoltaic or electrical properties. However, cyclopentasilane is relatively volatile, and there has been a recent interest in methods of forming higher molecular weight silanes that have similar chemical properties, but that are less volatile at ambient temperatures.

FIG. 1A shows an equation for the catalytic dehydrogenative polymerization of cyclopentasilane by a Zr catalyst such as $Cp_2ZrR_2$ (Cp=cyclopentadienyl; R=H, alkyl, aryl or trialkylsilyl). The product is a polysilane with relatively high molecular weight, but which can be intractable or insoluble, even in nonpolar organic solvents. It is believed that Zr complexes (and other early transition metal-based catalysts) tend to form polysilanes with an undesirably high degree or incidence of branching, which can make the polysilane less soluble, and in the extreme case, insoluble.

FIG. 1B shows an equation for the idealized catalytic dehydrogenative polymerization of cyclopentasilane. The polymerized product contains substantially linear poly(cyclopentasilane), with a minimum (or no) branching. Such a poly(cyclopentasilane) is expected to be relatively soluble in nonpolar solvents, and could increase the viscosity of an ink containing the poly(cyclopentasilane) to further facilitate processes of coating or printing the ink on a substrate. However, in practice, actual cyclopentasilane polymers have appreciable and/or significant branching and/or cross-linking. Thus, a need and/or desire for an improved (cyclo)silane polymerization process is felt.

SUMMARY OF THE INVENTION

An object of the invention is to provide a composition comprising an oligosilane or polysilane consisting essentially of (i) hydrogen and (ii) silicon and/or germanium, having a molecular weight of from 450 to about 2300 g/mol, which, after coating or printing the composition (optionally with simultaneous or immediately subsequent UV irradiation) and forming an oligo- and/or polysilane film, then curing, forms an amorphous, hydrogenated semiconductor film having a carbon content of not greater than 0.1 at %. In alternative embodiments, the oligosilane or polysilane may have a chain length of from 10 to 10,000, 100,000 or 1,000,000 silicon and/or germanium atoms.

Another object of the invention is to provide a composition comprising an oligosilane or polysilane of consisting essentially of (i) hydrogen and (ii) silicon and/or germanium, having a molecular weight of from 450 to about 2300 g/mol and a polydispersity index of ≤2.5. In alternative embodiments, the oligosilane or polysilane may have a polydispersity index of >2.5 (e.g., <4), and/or the oligosilane or polysilane (e.g., having such polydispersity or other characteristic or property) may have a chain length ranging from 10 to 10,000, 100,000 or 1,000,000 silicon and/or germanium atoms. In any case, the resulting oligo-/polysilanes can be linear, branched or crosslinked, and may contain essentially random linear and/or cyclic blocks, sections or chains.

Another object of the invention is to provide a polysilane of the formula $H-[(AHR)_n(c-A_mR^1_{2m-2})_q]-H$, where each instance of A is independently Si or Ge; each instance of R and $R^1$ is independently H, $-A_bH_{b+1}R^2_b$ (where $R^2$ is H or aryl), or aryl, but if q=0 and A is Si, R is not phenyl; (n+b)≥10 if q=0, q≥2 if n=0, and (n+q)≥2 if both n and q≠0; and each instance of m is independently from 4 to 6.

Yet another object of the invention is to provide a method of making an oligosilane or polysilane, comprising combining a silane compound of the formula $A_nH_{2n+2}$ and/or a cyclosilane compound of the formula $c-A_mH_{2m}$ with a heterogeneous catalyst consisting essentially of an elemental Group 7-12 transition metal (or a substrate-anchored derivative thereof) to form the oligosilane or polysilane, where each instance of A is independently Si or Ge, n is an integer of from 1 to 10, and m is an integer of from 4 to 6; and removing the catalyst from the oligosilane or polysilane.

Another embodiment of the invention provides a method of making a polysilane, comprising (a) combining a silane compound of the formula $A_aH_{2a+2-b}R_b$ and/or the formula $c-A_mH_{pm}R^1_{rm}$ with an elemental metal catalyst or a catalyst of the formula $R^3_xR^4_yR^5_zMX_w$ (or a multinuclear or substrate-anchored derivative thereof) to form a polysilane of the formula $H-[(A_aH_{2a-b}R_b)_n-(c-A_mH_{(pm-2)}R^1_{rm})_q]-H$, where each instance of A is independently Si or Ge, 1≤a≤100, and each instance of R and $R^1$ is independently hydrogen, aryl or $-A_cH_{2c+1-d}R^2_d$ (where $R^2$ is aryl, alkyl or H, and c is an integer from 1 to 4); n*a≥6 if q=0, q≥2 if n=0, and (n+q)≥2 if both n and q≠0; m is an integer from 3 to 8, p=2−r, and r is 0 or 1 or 2; M is a metal selected from the group consisting of Rh, Fe, Ru, Os, Co, Ir, Ni, Pd, and Pt, each of x, y, z and w is an integer of from 0 to 5, and 3≤(w+x+y+z)≤6; each instance of $R^3$, $R^4$ and $R^5$ is independently a substituted or non-substituted cyclopentadienyl, indenyl, fluorenyl, allyl, benzyl, silyl, (per)alkylsilyl, germyl, (per)alkylgermyl, hydride, phosphine, amine, sulfide, carbon monoxide, nitrile, isonitrile, siloxyl, germoxyl, hydrocarbyl, hydrocarbyloxy, hydrocarbylphosphino, hydrocarbylamino, or hydrocarbylsulfido ligand, or two or more of $R^3$, $R^4$ and $R^5$ together may be a polydentate phosphine, amine, oxo and/or carbido ligand; and X is a halogen or halogen-equivalent; and (b) removing the catalyst from the poly(aryl)silane.

It is yet another object of the present invention to provide a method of forming a semiconductor film from a composition containing an oligosilane or polysilane, comprising (1) coating or printing the composition onto a substrate, optionally with simultaneous and/or immediate subsequent UV irradiation; (2) heating the coated or printed composition sufficiently to form an amorphous, hydrogenated semiconductor;

and optionally (3) annealing and/or irradiating the amorphous, hydrogenated semiconductor sufficiently to at least partially crystallize and/or reduce a hydrogen content of the amorphous, hydrogenated semiconductor and form the semiconductor film.

BRIEF DESCRIPTION OF THE DRAWINGS

FIG. 12 shows impurity data from SIMS analysis of poly(cyclopentasilane) films prepared from Rh black-catalyzed oligo-/polymerization of cyclopentasilane according to an embodiment of the present invention.

DETAILED DESCRIPTION OF THE PREFERRED EMBODIMENTS

Figure 1A:
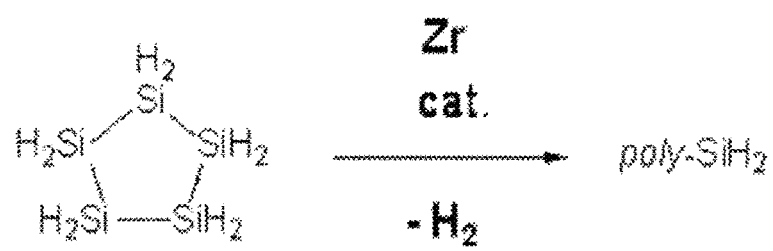
FIG. 1A is a chemical equation showing the polymerization reaction of cyclopentasilane by Zr catalysts.
Figure 1B:
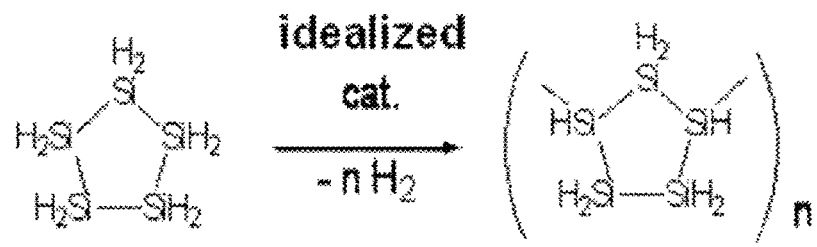
FIG. 1B is a chemical equation showing an idealized catalytic polymerization reaction of cyclopentasilane.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following disclosure numerous specific details are given to provide a thorough understanding of the invention. However, it will be apparent to one skilled in the art that the present invention may be practiced without these specific details. In other instances, well-known methods, procedures, components, and circuits have not been described in detail, to avoid unnecessarily obscuring aspects of the present invention.

For the sake of convenience and simplicity, the terms "coupled to," "connected to," and "in communication with" (and variations thereof) mean direct or indirect coupling, connection or communication, unless the context clearly indicates otherwise. These terms are generally used interchangeably herein, and wherever one such term is used, it also encompasses the other terms, unless the context clearly indicates otherwise. In the present disclosure, the term "deposit" (and grammatical variations thereof) is intended to encompass all forms of deposition, including blanket deposition (e.g., CVD and PVD), coating, and printing. Furthermore, with regard to certain materials, the phrase "consisting essentially of" does not exclude intentionally added dopants, which may give the material to which the dopant is added (or the element or structure formed from such material) certain desired (and potentially quite different) physical and/or electrical properties. The term "(poly)silane" refers to compounds or mixtures of compounds that consist essentially of (1) silicon and/or germanium and (2) hydrogen, and that predominantly contain species having at least 15 silicon and/or germanium atoms. Such species may contain one or more cyclic rings. The term "(aryl)silane" refers to a silane, polysilane or cyclosilane that may or may not contain an aryl or substituted aryl group bound thereto. The term "(cyclo)silane" refers to compounds or mixtures of compounds that consist essentially of (1) less than 15 silicon and/or germanium atoms and (2) hydrogen, and that may contain one or more cyclic rings. In a preferred embodiment, the (poly)- and/or (cyclo)silane has a formula $Si_xH_y$, where x is from 3 to about 200, and y is from x to (2x+2), where x may be derived from an average number molecular weight of the silane. The term "hetero(cyclo)silane" refers to compounds or mixtures of compounds that consist essentially of (1) silicon and/or germanium, (2) hydrogen, and (3) dopant atoms such as B, P, As or Sb that may be substituted by one or more conventional hydrocarbyl, silyl or germyl substituents and that may contain one or more cyclic rings. Also, a "major surface" of a structure or feature is a surface defined at least in part by the largest axis of the structure or feature (e.g., if the structure is round and has a radius greater than its thickness, the radial surface[s] is/are the major surface of the structure; however, where the structure is square, rectangular or oval, the major surface of the structure is typically a surface defined by the two largest axes, generally the length and width).

Divided metal powders (e.g., having an average particle size of ≤100 microns, preferably ~10 microns or less), including those of Rh and Ru (commonly called "Rh black" and "Ru black"), efficiently catalyze the dehydrogenative coupling of silanes such as cyclopentasilane, pentasilane and heptasilane to oligo- and polysilanes. In addition, Rh complexes such as $(PPh_3)_3RhCl$ (known as Wilkinson's catalyst) and other Rh (I) complexes, such as $[(CO)_2RhCl]_2$, catalyze the polymerization and/or oligomerization of (cyclo)silanes to dimers, trimers and higher order polymers and/or oligomers.

The polysilane materials of the present invention have low carbon content and excellent physical properties for making silicon thin films via spincoating or printing (e.g., inkjet printing). These materials are uniquely suited for making printed semiconductor devices (e.g., transistors, capacitors, diodes, etc.) and circuits including the same on various substrates, including but not limited to glass (e.g., quartz, amorphous silicon dioxide, etc.) sheets, wafers or slips, plastic and/or metal foils or slabs (e.g., polyimide or polyethylene sheets, or stainless steel or aluminum foils), silicon wafers, etc., all of which may carry one or more additional layers thereon (e.g., providing one or more dielectric, buffer, planarization and/or mechanical support functions, etc.). Applications for such films and devices (and products made therefrom on such substrates) include, but are not limited to displays (e.g., flat panel, plasma, LCD, organic or inorganic LED, etc.), RF and/or RFID devices, EAS devices, so-called "smart" tags (high frequency devices such as toll booth tags), sensors, and photovoltaics.

The present method(s) enable controlled polymerization and/or oligomerization of cyclic and linear hydrosilanes (e.g., of the general formula $Si_nH_{2n}$ or $Si_nH_{2n+2}$, respectively). The present methods can also be applied to arylsilanes of the general formula $Si_nAr_pH_q$ (e.g., $Si_nAr_nH_{n+2}$), where Ar is an aryl group, n is 1-10 (preferably 1-5), and (p+q)=2n or (2n+ 2). Exemplary starting materials include cyclohydrosilanes, such as cyclopentasilane ($Si_5H_{10}$), linear silanes, such as heptasilane ($Si_7H_{16}$), pentasilane ($Si_5H_{12}$), trisilane ($Si_3H_8$), etc., to produce a soluble polyhydrosilane-containing material for use as a precursor to silicon thin films with very low carbon content. It is also contemplated that alkyl- and/or aryl-substituted hydrosilanes can also be polymerized and/or oligomerized using the present methodology, and that polyarylsilanes made according to the present method(s) can be de-arylated (e.g., by halogenation and reduction; see U.S. patent application Ser. Nos. 10/789,317, 11/246,014 and 11/249,167,respectively filed on Feb. 27, 2004, Oct. 6, 2005 and Oct. 11, 2005, the relevant portions of which are incorporated herein by reference) to provide high molecular weight, low volatility polysilanes.

Catalytic Heterogeneous Dehydrogenative Coupling of Silanes

In one aspect of the present invention, finely divided metal powders (e.g., having an average particle size of ~10 microns), including those of Rh and Ru (commonly called "Rh black" and "Ru black") efficiently catalyze polymerization of fully hydrogenated silanes, such as cyclopentasilane and heptasilane. The catalytic polymerization reactions of such hydrosilanes with Rh black are reproducible, and provide control of product molecular weight via reaction time. Finely divided powders of other metals also have polymerization activity.

In general, the method of heterogeneously making an oligosilane or polysilane includes combining a silane compound of the formula $A_nH_{2n+2}$ and/or a cyclosilane compound of the formula $c-A_mH_{2m}$ with a heterogeneous catalyst consisting essentially of an elemental Group 7-12 transition metal or a substrate-anchored or -supported derivative thereof to form the oligosilane or polysilane, where each instance of A is independently Si or Ge; n is an integer of from 1 to 10; and m is an integer of from 4 to 6; and removing the catalyst from the oligosilane or polysilane. Suitable Group 7-12 transition metals are Rh, Fe, Ru, Os, Co, Ir, Ni, Pd, and Pt. Preferably, the Group 7-12 transition metal is selected from the group consisting of Rh and Ru.

Figure 2:
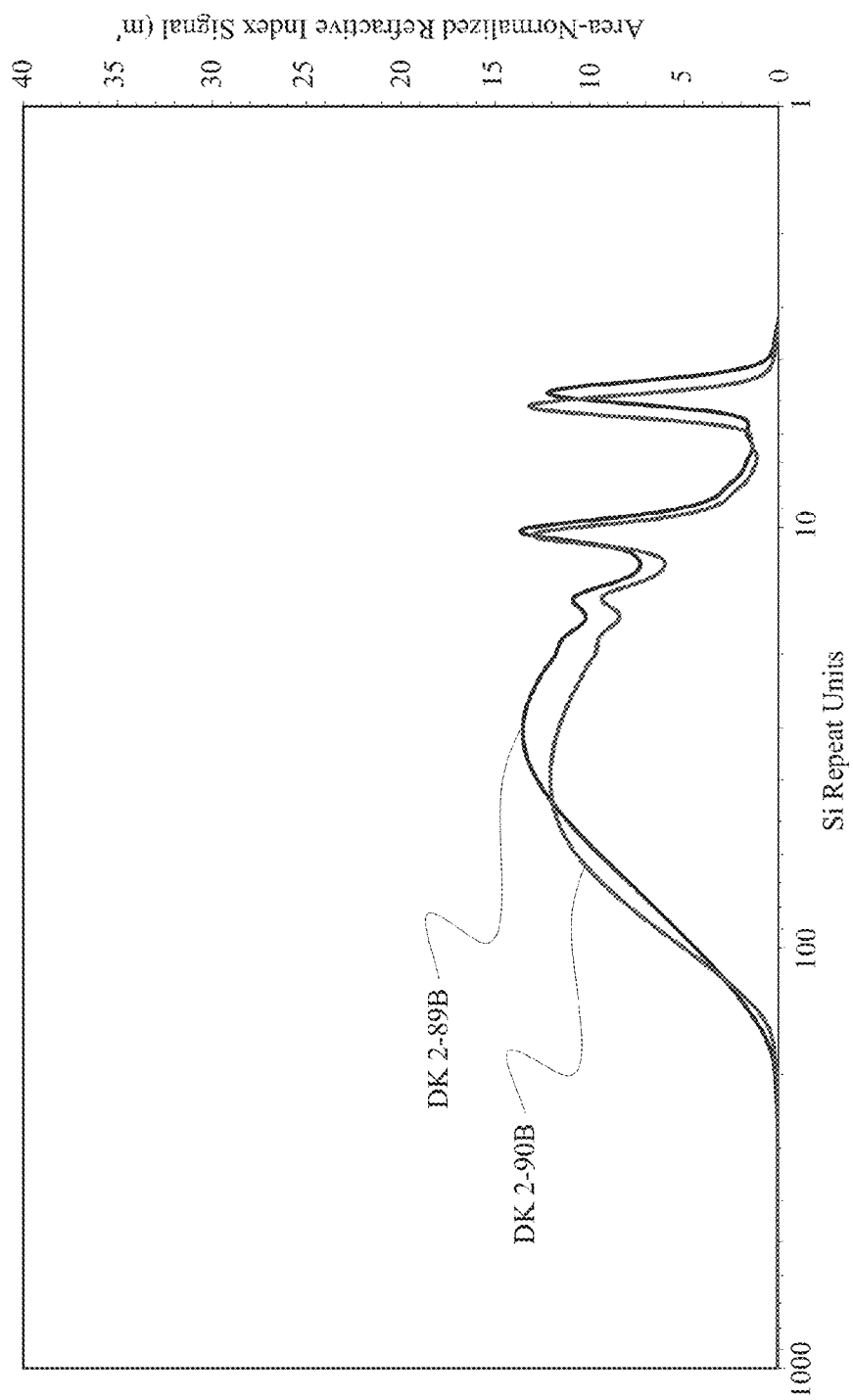
FIG. 2 shows gel permeation chromatography (GPC) data for polysilanes made by Rh-black catalyzed oligo- and/or polymerization of cyclopentasilane in accordance with an embodiment of the present invention.

FIG. 2 shows representative GPC data for polysilanes made by Rh-catalyzed cyclopentasilane polymerization for two different runs. Reaction conditions included use of 1 mol % Rh black, a 2 h reaction time, and reaction quenching/extraction of the polymer product with cyclohexane. The workup included drying under vacuum for 2 h. The GPC trace shows the area-normalized refractive index signal (y-axis) as a function of the number of Si repeat units (i.e., Si atoms, x-axis). The polymerization reaction shows acceptable reproducibility.

One major advantage of polymerizing fully hydrogenated silanes is that no further steps (e.g., post-polymerization) are required to convert the polymeric material into polyhydrosilane, thereby minimizing chances of introducing contaminants into the system, particularly carbon impurities. The use of metal powders as catalysts is also advantageous for producing polyhydrosilanes with low carbon impurity levels because the catalyst has no carbon-based ligands that may leach into, react with or otherwise contaminate the reaction mixture, and the catalyst can be easily removed at the end of the reaction by filtration through an inert adsorbent, such as Celite. These features make the present invention an effective alternative to other polysilane synthesis techniques that involve post-polymerization chemistry (e.g., dephenylation of polyphenylsilane) and/or homogeneous catalysis (e.g., using a soluble organometallic catalyst that has carbon- and/or other impurity-containing ligands). The purity difference is most clearly seen in the carbon levels in films derived from polysilanes synthesized by the present method vs. prior methods (e.g., 0.03-0.05 at % C for present invention vs. >0.15 at % C [typically] via the chloro-dephenylation/reduction methodology, as determined by SIMS analysis).

Figure 3:
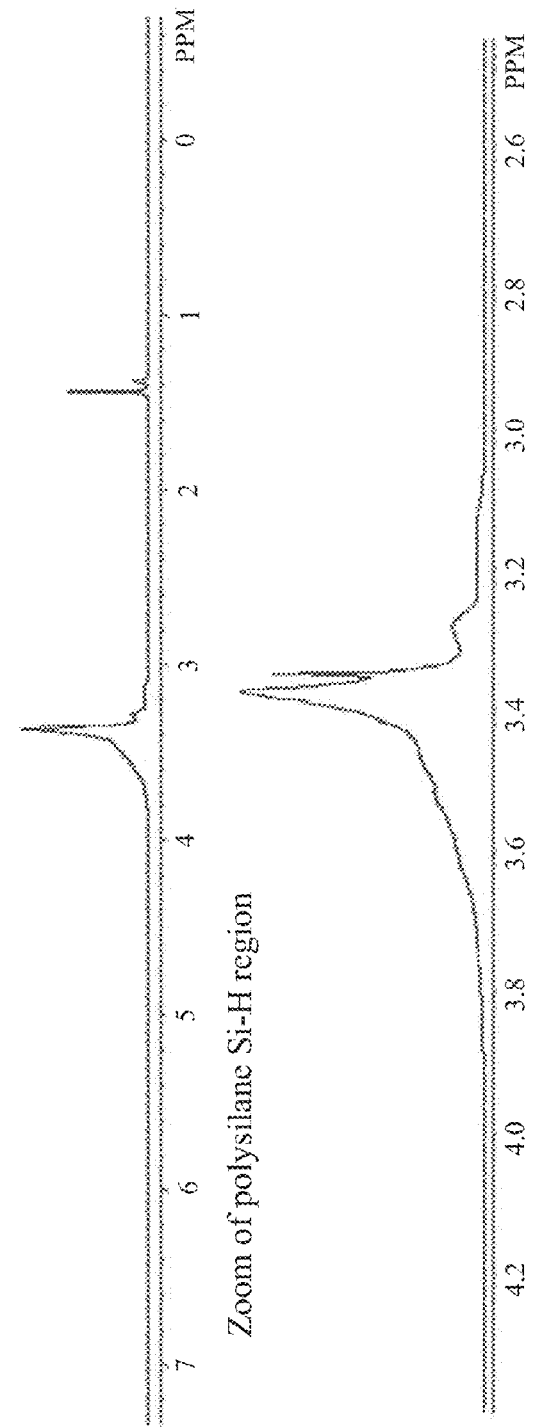
FIG. 3 shows proton nuclear magnetic resonance (NMR) data for poly(cyclopentasilane) made by Rh-black catalyzed oligo- and/or polymerization in accordance with an embodiment of the present invention.
Figure 4A:
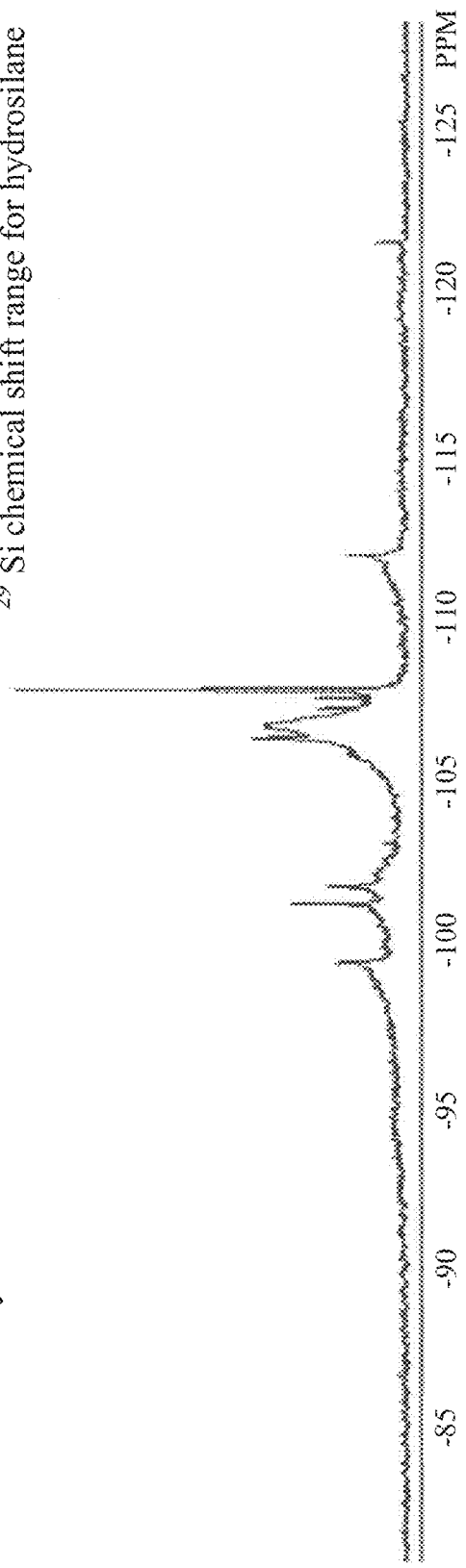
FIG. 4A shows silicon NMR data for poly(cyclopentasilane) according to an embodiment of the present invention.
Figure 4B:
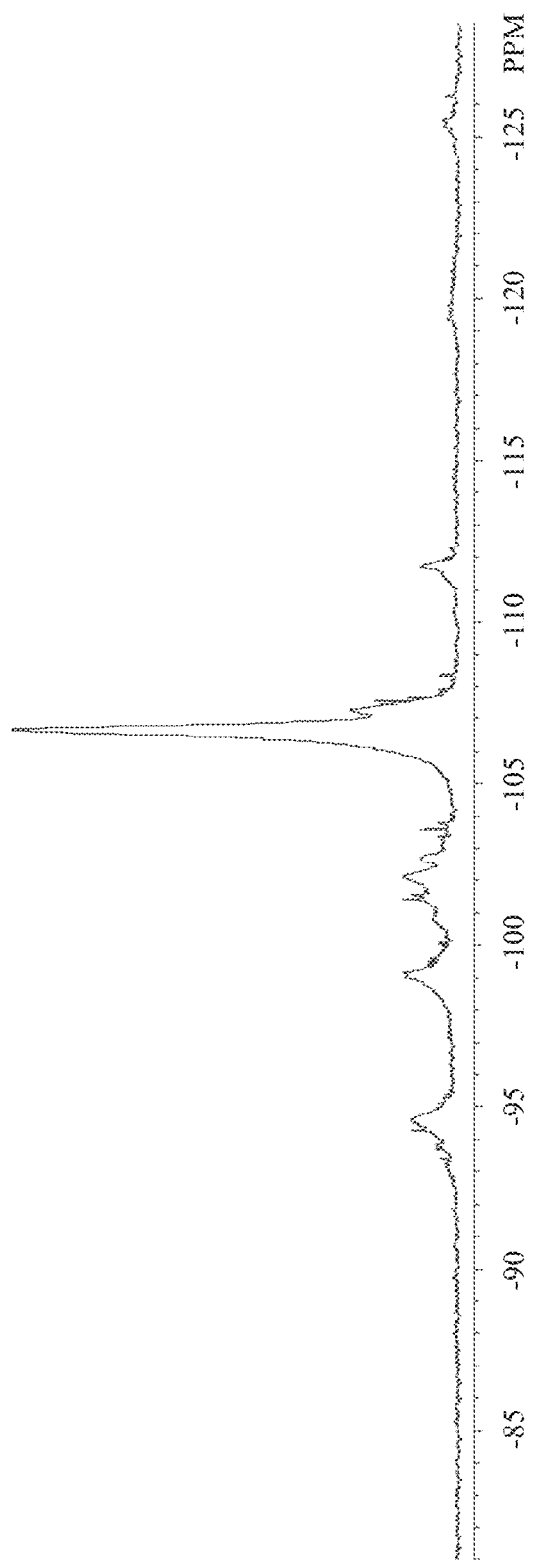
FIG. 4B shows silicon NMR data for a polyhydrosilane prepared by a comparative method.

As further shown in FIG. 3, the $^1H$ NMR spectrum of an oligo/poly(cyclopentasilane) mixture made by a typical process shows Si-H shift values between 3-4 ppm that are typical or comparable to shift values of other hydrosilanes. (The peaks at about 1.4 ppm correspond to cyclohexane and deuterated cyclohexane.) FIG. 4A is the $^{29}Si$ NMR spectrum of an oligo-/poly(cyclopentasilane) mixture made by a typical process, showing peaks in the −80 to −140 ppm range, typical of the chemical shifts for Si atoms of hydrosilanes. A comparative $^{29}Si$ NMR spectrum of an oligo-/poly(cyclopentasilane) mixture made by a process involving catalytic dehydrogenative coupling of phenylsilane, followed by chlorodephenylation and reduction, is shown in FIG. 4B. The differences in shift values and relative peak intensities appear to reflect different polymer microstructures for the respective products of the different polymerization reactions.

In one embodiment of the method, the starting silane compound is combined with a rhodium metal catalyst. Preferably, the rhodium metal catalyst comprises rhodium black, in particular wherein the rhodium metal catalyst comprises a powder having a mean or average particle size of one hundred microns or less. The rhodium metal catalyst may consist essentially of rhodium powder having a size distribution where at least 90% of the powder has a particle size of less than one hundred microns; in particular wherein at least 99% of the powder has a particle size of less than one hundred microns. In further embodiments, the powder has a particle size of ten (10) microns or less. In another embodiment, the rhodium metal catalyst consists essentially of rhodium nanoparticles or nanoparticles of another late transition metal (see the following paragraph). Such nanoparticles may be passivated or unpassivated, but if passivated with a species other than hydrogen, the passivation should be at least partially removed immediately prior to use. Such passivation removal may be done in situ.

Alternative embodiments utilize other pure late transition metals (groups 7-12) such as Pt, Pd, Ir, Ru, and Os, as well as late transition metals supported on silica, alumina, silicates, aluminates, aluminosilicates (e.g., zeolites), or other stationary phases (for example, Rh on $Al_2O_3$). Thus, suitable heterogeneous catalysts may be selected from the elemental Group 7-12 transition metals, in particular a powder of such metals having a mean or average particle size of 100 microns or less, preferably a powder having a mean or average particle size of 10 microns or less.

Figure 5:
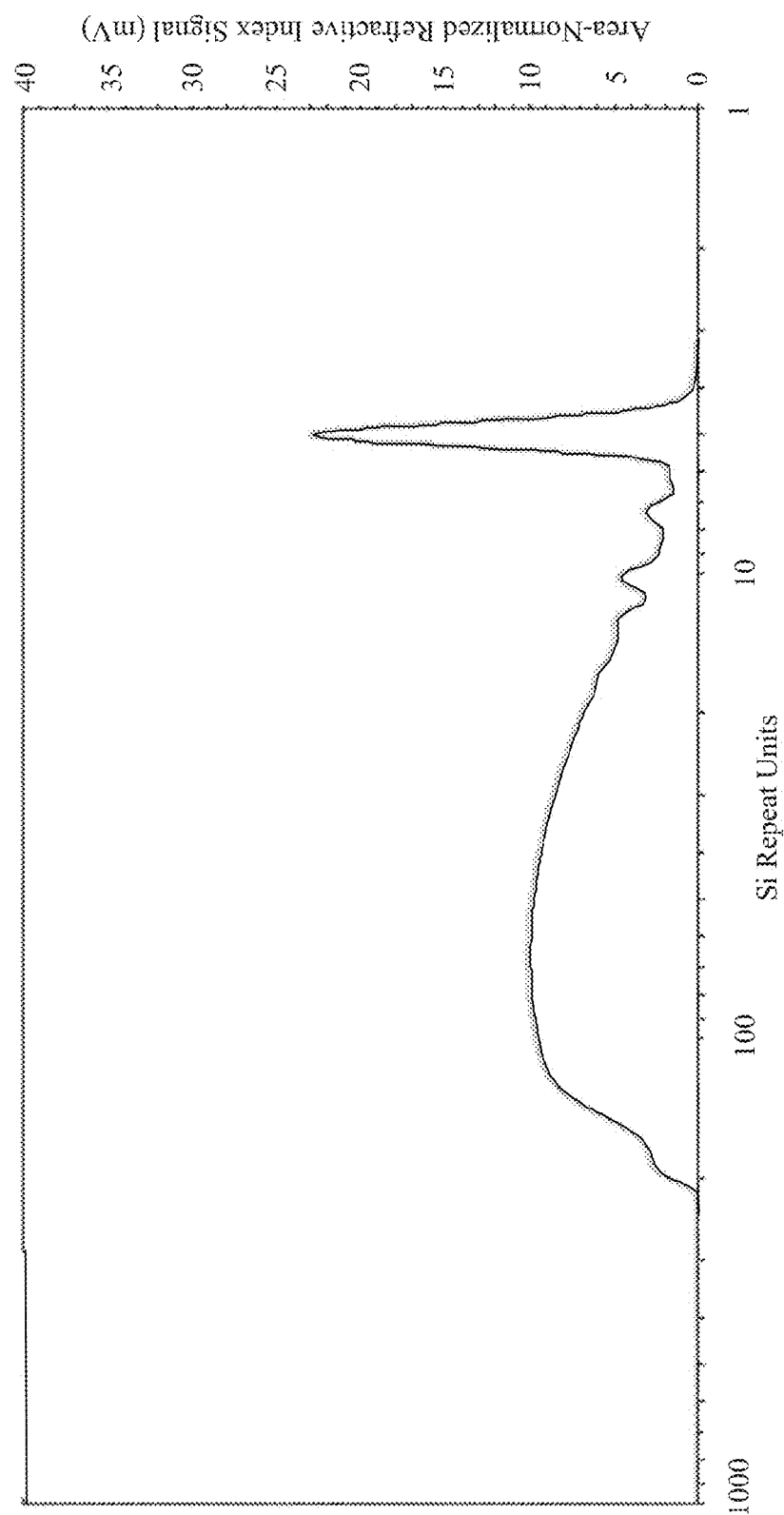
FIG. 5 shows GPC data for poly(cyclopentasilane) made by polymerization of cyclopentasilane using Ru black as a catalyst in accordance with an embodiment of the present invention.

For example, FIG. 5 shows GPC data for the polymerization of cyclopentasilane by Ru black (0.2 at % Ru atoms, relative to total Si atoms in the reaction mixture) for 24 h. The data in FIG. 5 shows consumption of most of the monomer (>70 wt %) and a relatively controlled molecular weight distribution of product, from about 10 Si atoms (i.e., dimer) to about 200 atoms (e.g., 40-mer). Most of the product distribution is in the range of from 15 to about 110 Si atoms, with a maximum at about 60-70 Si atoms.

The catalyst may be activated or pre-treated prior to the polymerization reaction. Thus, the present method may also include washing the catalyst with one or more organic solvents (e.g., with one or more nonpolar solvents such as a $C_5$-$C_{10}$ alkane or cycloalkane, a $C_6$-$C_{10}$ arene, a $C_4$-$C_8$ dialkyl ether, etc., and/or one or more polar solvents such as a $C_3$-$C_6$ alkyl ketone or cycloalkyl ketone, a $C_4$-$C_6$ cyclic ether such as tetrahydrofuran or dioxane, a $C_1$-$C_{10}$ alkanol or cycloalkanol, etc.), and heating the catalyst under vacuum or in an inert and/or reducing atmosphere to dry it, prior to combining it with the silane and/or cyclosilane compound. In particular, the catalyst may be washed with a polar solvent, and separately, with a non-polar solvent. For example, the polar solvent may be acetone, and the non-polar solvent may be toluene. In another embodiment, the activation of the catalyst may include a similar heat treatment in air to "burn off" organic impurities, followed by a subsequent reduction of any oxidized catalyst in forming gas (e.g., $H_2$, optionally in the presence of CO, in the optional further presence of an inert gas such as $N_2$, He, Ar, etc.).

In preferred embodiments, the silane compound has the formula $A_nH_{2n+2}$, wherein A is Si and n is an integer of from 1 to 10, especially wherein n is an integer of from 1 to 3. In other embodiments, the silane compound has the formula c-$A_mH_{2m}$, in particular where A is Si and m is 5. In addition to heptasilane, $Si_7H_{16}$, and cyclopentasilane, c-$Si_5H_{10}$, other silane starting materials that may be used include monosilane, disilane, trisilane, cyclotetrasilane, pentasilane, cyclohexasilane, and polysilanes. Thus, linear, cyclic, or branched silanes of the general formulae $Si_nH_{2n+2}$ or -$Si_nH_{2n}$-, where n is an integer of 1, 2, 3, 4, 5, or 6, up to 10, 15 or 20, or any range of values therein (particularly where n is 1 to 5 or 1 to 3) may be polymerized and/or oligomerized by the present method.

Figure 6:
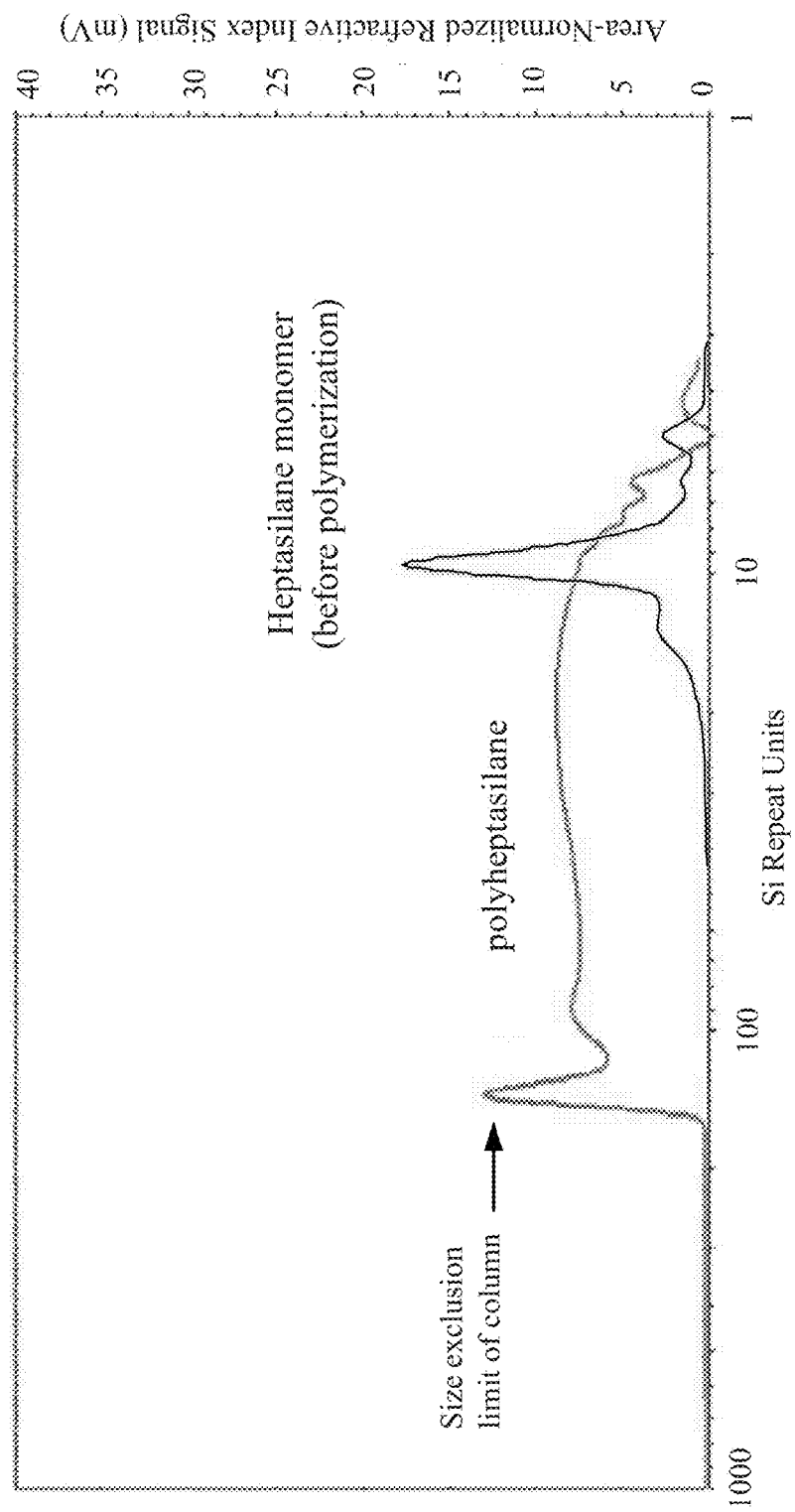
FIG. 6 shows GPC data for poly(heptasilane) made by Rh-black catalyzed oligo- and/or polymerization in accordance with an embodiment of the present invention.

FIG. 6 shows GPC data for the polymerization of heptasilane by Rh black (0.2 at % Rh atoms, relative to total Si atoms in the reaction mixture) for 24 h. The data in FIG. 6 shows substantially complete consumption of monomer (>90%) and relatively even distribution of product, from about 14 Si atoms (i.e., dimer) to about 100 atoms (e.g., 12-mer to 14-mer). A significant fraction of product is identified at the size exclusion limit of the GPC column (e.g., at about 150 Si atoms).

The use of monosilane, disilane or trisilane instead of heptasilane or cyclopentasilane has significant economical advantages, although such low molecular weight starting silanes advantageously employ a process comprising passing the silane gas over a supported catalyst such as rhodium on alumina or ruthenium on alumina, under high pressure (e.g., at least 5 or 10 atm, up to 15, 20 or 30 atm) or autoclave conditions, and recovering a liquid-phase product therefrom. The supported catalysts rhodium on alumina or ruthenium on alumina are commercially available in powder (5 wt % metal) or pellet (0.5 wt % metal) forms from Sigma-Aldrich Chemical Co., Milwaukee, Wis. In various alternative embodiments, the oligo-/polymerization of low molecular weight starting silanes can be conducted using an unsupported catalyst, optionally in a relatively nonpolar solvent, and/or at a pressure of at least 1, 2, 3 atm or any value ≥1 atm.

Furthermore, the ability to polymerize small linear silanes (e.g., $Si_3H_8$, $Si_2H_6$, or, potentially, $SiH_4$) differentiates the present invention from other approaches that rely on UV polymerization of cyclic silanes. Since cyclic silanes (such as c-$Si_5H_{10}$) are not commercially available and are generally challenging to purify to semiconductor-grade quality, the present method offers a route to polysilane materials (from relatively low molecular weight silanes) that is cheaper and that produces materials of potentially higher purity than approaches based on UV polymerization of cyclic silanes. In addition, the present method may provide better control of the product molecular weight distribution and molecular weight range than UV polymerization, and may provide oligo-/polysilanes with greater stability (neat and/or in solution) and longer shelf life (e.g., at a variety of temperatures and/or other storage conditions).

In further embodiments, the starting materials may advantageously include one or more dopant species, preferably including compounds containing (or consisting essentially of) silicon and/or germanium, hydrogen, and a dopant atom such as B, Ga, P, As, Sb, etc. For example, a dopant species particularly suitable for use in the present methods of making oligo- and/or polysilanes includes compounds of the formula $D(A_xH_{2x+1})_3$ (e.g., $D(AH_3)_3$), where D is selected from the group consisting of B, Ga, P, As and Sb, A is Si or Ge, and each x is independently an integer of from 1 to 4. Another species includes compounds of the formula $AH_y(DH_2)_z$ (e.g., $A(DH_2)_4$), where A and D are as described herein and (y+z)=4.

In various embodiments, the catalyst is present in an amount of from 0.01 to 10 transition metal atoms to 100 atoms of silicon, or any range of values therein. For example, the catalyst may be present in an amount of from 0.1 to 5 or from 0.5 to 3 transition metal atoms to 100 silicon atoms.

In one embodiment of the method, the silane compound and the Group 7-12 transition metal are combined and reacted for a length of time sufficient to form the oligosilane or polysilane (e.g., as described herein). Generally, the present polymerization reaction is conducted at ambient temperatures (e.g., without applied heating or cooling; from about 15 to less than 30° C., or any range of values therein). However, it is anticipated that the silane compound and the Group 7-12 transition metal may be combined and reacted at a temperature of from about −196° C. (e.g., the temperature of liquid nitrogen), at least about −78° C. (e.g., the temperature of dry ice baths), or 0° C. (e.g., the temperature of ice) to ambient temperature or higher (e.g., at a temperature of ≥20° C.), or any range of temperatures therein, for a length of time sufficient to form the oligosilane or polysilane. For example, the reaction may be conducted at a temperature of up to the boiling point of the silane monomer (e.g., when the monomer is liquid at ambient temperature), or in some cases up to 300-500 ° C. (e.g., for gas-phase silane monomers such as silane [$SiH_4$], disilane [$Si_2H_6$] or trisilane [$Si_3H_8$], and/or when the reaction is conducted at a pressure ≥1 atm).

In general, when the reaction is conducted in a solvent or when coupling liquid-phase silane monomers neat, the reaction time may be at least 1 min, 10 min, or 1 h. For example, the reaction may be conducted for a length of time of from 1 to 96 h., 1 to 48 h., 1.5 to 24 h., or any range of values therein. For many metals (e.g., Rh and Ru) and silanes (e.g., cyclopentasilane and heptasilane), a reaction time of 2 h. is sufficient to consume most of the monomer (e.g., at least 60%, 65% or 70%), increase the average molecular weight (e.g., the weight-average or number average molecular weight, but preferably expressed as an average number of silicon atoms) by at least 100%, 200%, or more, and/or increase the viscosity of an ink consisting essentially of 1-20 wt.% of the polysilane product in a $C_6$-$C_{10}$ cycloalkane solvent to form a substantially uniform silicon film after drying and curing the ink (e.g., relative to an otherwise identical ink in which the silicon component comprises at least 80% of the corresponding monomer). Alternatively, when the reaction is run in the gas phase, contact time between the gas-phase silane monomer and the catalyst may be quite short, although the total time for passing the gas-phase reactants over the catalyst may be relatively long.

Figure 7:
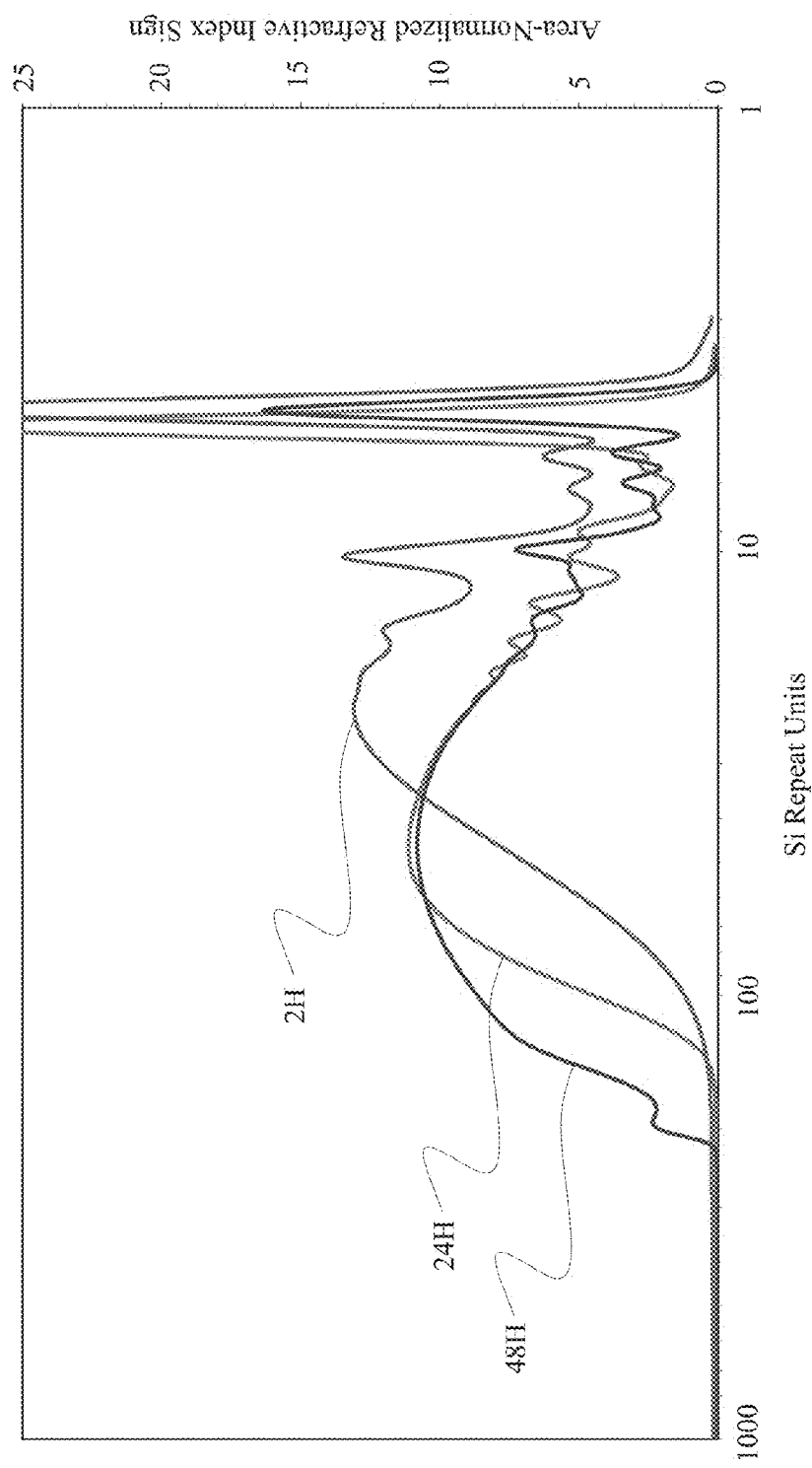
FIG. 7 shows GPC data demonstrating variations in the molecular weight distribution of poly(cyclopentasilane) according to the reaction time in accordance with embodiments of the present invention.

FIG. 7 shows GPC data for polymerization reactions run under identical conditions, except for the reaction time. The data in FIG. 7 show that the average molecular weight increase with reaction time, but that the peak of the polymeric product (at about 50 Si atoms) does not appear to change significantly after 24 h. In the data of FIG. 7, residual monomer (cyclopentasilane) was not removed under vacuum. The monomer content of the 2 h. reaction is about 20% as shown by integration of the area under the curve (i.e., about 80% conversion to polymer).

Although generally not necessary, the present polymerization reaction may be conducted at a higher or lower temperature. For example, the higher molecular weight and/or more highly branched polysilanes may be formed when the reaction is conducted at a temperature of at least 30° C. (e.g., 30-100° C., or any range of values therein). For example, the reaction can be conducted at a temperature ≥50° C. Alternatively, the present polymerization reaction may be conducted at a temperature of <0° C.

Other embodiments with regard to reaction conditions include conducting the polymerization in a solvent, or modifying the pressure and temperature at which the reaction is carried out. For example, solvents for the present polymerization reaction generally include nonpolar organic solvents such as $C_5$-$C_{10}$ alkanes and cycloalkanes such as cyclohexane, cyclooctane and decalin, $C_6$-$C_{10}$ arenes such as benzene, toluene and tetralin, $C_4$-$C_s$ dialkyl ethers such as diethyl ether and methyl t-butyl ether, etc.

In general, the catalyst may be immobilized on and/or anchored to a support or substrate, and removing the catalyst from the oligosilane or polysilane may comprise filtering the immobilized and/or anchored catalyst. Suitable supports/substrates include silica, alumina, a silicate, an aluminate, and/or an aluminosilicate. Alternatively, the catalyst may be removed by filtering the reaction mixture. In one embodiment, filtering comprises passing the reaction mixture through a pad or bed of adsorbent. Suitable adsorbents include a chromatography gel or finely divided oxide of silicon and/or aluminum (including silicates, aluminates and/or aluminosilicates) that is substantially unreactive with the oligosilane or polysilane. A preferred adsorbent is Celite. In other embodiments, filtering comprises passing the reaction mixture through a PTFE membrane filter with pore size less than 0.45 μm (e.g., 0.2 μm, or other value therein or therebelow) or a metal removing and/or purification filter and/or resin (such as is conventionally used for removing Pd and Rh catalysts from reaction mixtures).

Once polymerized, the polymer (or polymer mixture) may be characterized (e.g., to determine the molecular weight distribution, the identity and/or quantity of one or more impurity atoms, etc.). Characterization techniques for establishing microstructural features of the polymers may include mass-spectrometric methods (e.g., FAB-MS or ESI-MS), gas and/or gel permeation chromatography, nuclear magnetic spectroscopy (e.g., $^1H$ and/or $^{29}Si$), SIMS analysis (e.g., of deposited polysilane films after being converted to amorphous silicon upon curing), etc.

Catalytic Homogeneous Dehydrogenative Coupling of Silanes

Rhodium complexes such as $(PPh_3)_3RhCl$ (commonly known as Wilkinson's catalyst) and other Rh(I) complexes, such as $[(CO)_2RhCl]_2$, also catalyze the polymerization and/or oligomerization of (cyclo)silanes such as cyclopentasilane to dimers, trimers, and higher order poly-/oligomers, similar to the catalytic activity of Rh metal (as described above and elsewhere herein). As for the heterogeneous catalysis method, the homogeneous catalysis method involves formation of silicon-silicon bonds between (cyclo)silane monomers, with concomitant release of hydrogen gas. Generally, polysilane polymers and/or oligomers made by the present method are soluble in nonpolar solvents such as hexane, cyclohexane, cyclooctane and decalin.

Methods for producing polysilanes via homogeneous catalytic dehydrocoupling of phenylsilane (or other arylsilanes, such as tolylsilane) using Rh(I) or Ru complexes, with subsequent chlorination/dearylation and reduction, yield polysilanes but perhaps of lesser purity than can be obtained by dehydrogenative coupling of (cyclo)hydrosilanes by heterogeneous catalysis (e.g., using elemental late transition metal catalysts). Such oligo-/polysilanes may be particularly suitable for formation of thin films where atomic purity is less critical, such as the formation of silicon dioxide films (e.g., by annealing a dried and/or cured thin film from the present oligo-/polysilane in an oxygen source gas, such as dioxygen, ozone, nitrous oxide, nitric oxide, NO, etc.). Oxidative annealing to form oxide films from similar precursor materials is described at least in part in U.S. patent application Ser Nos. 10/616,147, 11/452,108, 11/888,949 and 11/818,078, filed on Jul. 8, 2003, Jun. 12, 2006, Jun. 11, 2007, and Jul. 31, 2007, the relevant portions of which are incorporated herein by reference. For example, one may deposit the present composition, cure it in an oxidizing atmosphere, or convert it to an amorphous and/or crystalline silicon film as described above and oxidize it subsequently. Means of oxidation include exposure to air, molecular oxygen in an inert gas carrier, water vapor, ozone, etc., in accordance with known techniques.

In general, oligo-/polysilanes can be made by combining a compound of the formula $A_aH_{2a+2-b}R_b$ and/or the formula c-$A_mH_{pm}R^1_{rm}$ with an elemental metal catalyst (as described in the section above) or a catalyst of the formula $R^3_xR^4_yR^5_zMX_w$ (or a multinuclear or substrate-anchored derivative thereof) to form a polysilane of the formula H-[$(A_aH_{2a-b}R_b)_n$-(c-$A_mH_{(pm-2)}R^1_{rm})$]-H, where each instance of A is independently Si or Ge, 1≤a≤100, and each instance of R and $R^1$ is independently hydrogen, aryl or -$A_cH_{2c+1-d}R^2_d$ (where $R^2$ is aryl, alkyl or H, and c is an integer from 1 to 4); n*a≥6 if q=0, q≥2 if n=0, and (n+q)≥2 if both n and q≠0; m is an integer from 3 to 8, p=2−r, and r is 0 or 1 or 2; M is a metal selected from the group consisting of Rh, Fe, Ru, Os, Co, Ir, Ni, Pd, and Pt, each of x, y, z and w is an integer of from 0 to 5, and 3≤(w+x+y+z)≤6; each instance of $R^3$, $R^4$ and $R^5$ is independently a substituted or non-substituted cyclopentadienyl, indenyl, fluorenyl, allyl, benzyl, silyl, (per)alkylsilyl, germyl, (per)alkylgermyl, hydride, phosphine, amine, sulfide, carbon monoxide, nitrile, isonitrile, siloxyl, germoxyl, hydrocarbyl, hydrocarbyloxy, hydrocarbylphosphino, hydrocarbylamino, or hydrocarbylsulfido ligand, or two or more of $R^3$, $R^4$ and $R^5$ together may be a polydentate phosphine, amine, oxo and/or carbido ligand; and X is a halogen or halogen-equivalent such as phenylsulfonyl, tolylsulfonyl, trifluoromethylsulfonyl, tetraphenylborate, tetrafluoroborate, hexafluorophosphate, etc.; and removing the catalyst from the poly(aryl)silane.

In certain embodiments, the method includes combining a compound of the formula $A_aH_{2a+2}$ and/or the formula $c\text{-}A_mH_{2m}$ to form a polysilane of the formula $H\text{-}[(A_aH_{2a})_n\text{-}(c\text{-}A_mH_{(2m-2)})_q]\text{-}H$.

Alternative embodiments for catalytic dehydrogenative coupling of silanes to produce the present oligo-/polysilanes utilize other late transition metals (e.g., from Groups 7-12 of the Periodic Table). Suitable metal complexes may contain chelating neutral or monoanionic phosphorus- or nitrogen-based ligands, such as bis-dialkylphosphinoalkanes (e.g., 1,2-bis-(diisopropylphosphino)ethane), diamines (e.g., bis-(dialkylamino)ethane and -propane), and bidentate heterocyclic ligands such as $\alpha,\alpha'$-bipyridyl and 2-(2'-pyridyl)indole. In addition, metal salts such as $RhCl_3$ that can be reduced in situ to more reactive states (e.g., Rh(I) species) are also useful. Ligand types such as triaryl- and trialkylphosphines and -amines, carbon monoxide [CO], π-coordinated allyl ligands, benzyl ligands, σ-alkyl groups, σ-aryl groups, alkoxy or aryloxy groups, alkylthio or arylthio groups, and trialkylsilyl groups are particularly suitable. Also, aluminum-containing compounds may act as co-catalysts in these reactions, such as $AlCl_3$, $AlMe_3$, and MAO (methylalumoxane).

Figure 8:
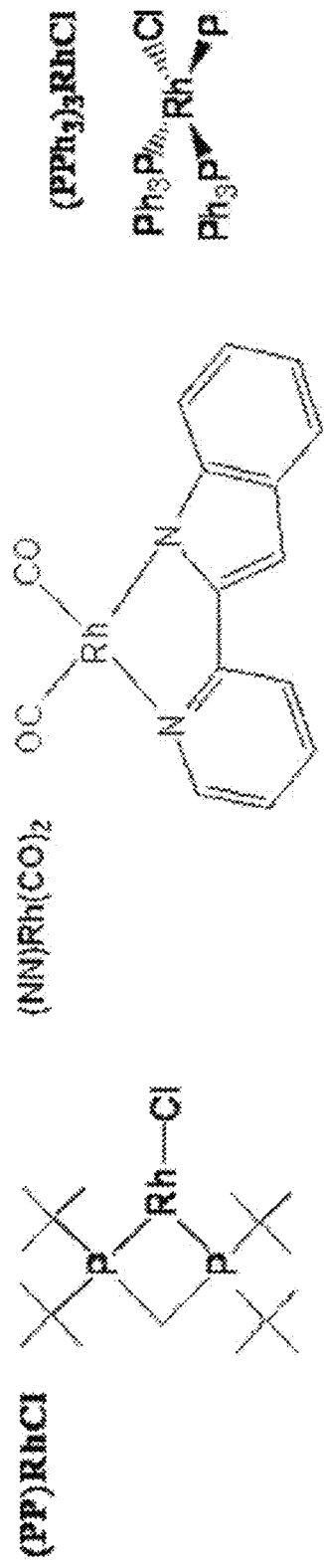
FIG. 8 shows chemical formulas for various Rh catalysts useful in certain homogeneous catalysis embodiments of the present method.

Among Rh complexes, preferred catalysts include $[(CO)_2RhCl]_2$, $(NN)RhH_2(SiEt_3)_2$ and $(PP)Rh(benzyl)$, where (NN) is a bidentate nitrogen-containing ligand such as 2-(2'-pyridyl)indole (see FIG. 8) and (PP) is a bidentate phosphine ligand such as bis-(di-t-butylphosphino)methane (see FIG. 8). Other ligands for coordination to the late transition metal may include tridentate phosphorus-, nitrogen-, oxygen and/or carbon-based ligands and mixed bidentate ligands (e.g., PN, PC, PO, NO, NC, OC).

In preferred embodiments, x is 1, 2 or 3, and $R^3$ is triphenylphosphine or CO. In general, two or three units of $R^3$, $R^4$ and $R^5$ may comprise a multidentate nitrogen-, phosphorus-, oxygen- and/or carbon-based ligand. In particular, two of $R^3$, $R^4$ and $R^5$ may comprise a bidentate ligand, bound to the metal through nitrogen and/or phosphorous atoms. In another embodiment x=1, y=1, and $R^3$ and $R^4$ together comprise 1,2-bis(diphenylphosphino)ethane. In another embodiment w=1 and X is Cl. In another example, w=0, z=1, and $R^5$ is hydrocarbyl or hydride.

A preferred catalyst M is Rh. M may comprise a Rh(0), Rh(I), Rh(III) or Rh(V) precursor. The catalyst may comprise a dimer, a binuclear species or a multinuclear species. In one embodiment x=1, y=1, and $R^3$ and $R^4$ together comprise 2-(2'-pyridyl)indolide. In another example, z=2, and $R^5$ is carbon monoxide (CO). In a preferred embodiment of the method, z is at least 1, and $R^5$ is H, $C_3$-$C_7$ allyl, aryl, benzyl, $SiR^2_3$, or $Si(SiR^2_3)_3$, where $R^2$ is H or $C_1$-$C_4$ alkyl. In another example w is 1, 2 or 3, and X is Cl. Among alternative heterogeneous Rh complexes, there are grafted/bound complexes (e.g., attached to a silica surface, as described herein).

Preferred arylsilane starting compounds have the formula $AH_aR_{4-a}$, especially where A is Si, R is phenyl, tolyl, mesitylyl, benzyl or naphthyl (particularly phenyl or tolyl), and a is 2 or 3 (particularly 3). In other embodiments, the silane compounds have the formula $A_nH_{2n+2}$, preferably where A is Si and/or Ge (particularly Si) and n is from 3 to 7, or the formula $c\text{-}A_mH_{2m}$, preferably where A is Si and m is 5.

Other silane starting materials that may be polymerized and/or oligomerized by this method include monosilane, disilane, trisilane, cyclotetrasilane, cyclohexasilane, and oligo-/polysilanes (linear, cyclic, or branched silanes of the general formulae $Si_nH_{2n+2}$ or $\text{-}Si_nH_{2n}\text{-}$, where n is an integer of 1, 2, 3, 4, 5, or 6, up to 10, 15 or 20, or any range of values therein, particularly where n is 1 to 5 or 1 to 3). Preferred embodiments include the polymerization and/or oligomerization of trisilane, $Si_3H_8$, heptasilane, $Si_7H_{16}$, and cyclopentasilane, $c\text{-}Si_5H_{10}$. Additionally, other arylsilane starting materials, such as oligo-/poly(phenylsilane), may be dehydrogenatively coupled using a late transition metal complex as described herein. The present method (both homogeneous and heterogeneous) may be particularly advantageous for oligo-/polymerization of linear hydrosilanes, such as $Si_3H_8$, $n\text{-}Si_4H_{10}$, $n\text{-}Si_5H_{12}$, $n\text{-}Si_7H_{16}$, etc.

Alternative starting materials include higher cyclosilanes, as well as other mono-and diaryl- and -alkyl(oligo)silanes, such as $H_3SiSi(Ph)HSiH_3$. Also, higher-molecular weight aryl- and alkyl-substituted oligosilanes (e.g., containing at least 3, and up to about 20, silicon atoms) can be used in the present method.

In a typical process, a solution of 1 mol % $(PPh_3)_3RhCl$ (or other homogeneous catalyst) in neat cyclopentasilane is stirred at room temperature for 2-48 h. The catalyst is then precipitated with hexane, which generally dissolves the polysilane/oligosilane products. The resulting mixture is filtered through an adsorbent such as Florisil®, and the solvent is evaporated to give a clear oil or gel-like material. As shown by the data in FIG. 9, the molecular weight distribution (shown as the number of Si atoms, or "Si Repeat Units" in the oligo-/polymer) includes substantial amounts of dimers and higher-order oligo-/polysilanes, up to 70-80 Si atoms in the case of $(PPh_3)_3RhCl$ and up to 140-150 Si atoms in the case of methylenebis-(di-t-butylphosphinyl)rhodium complexes (see, e.g., "(PP)RhCl" in FIG. 8).

Figure 9:
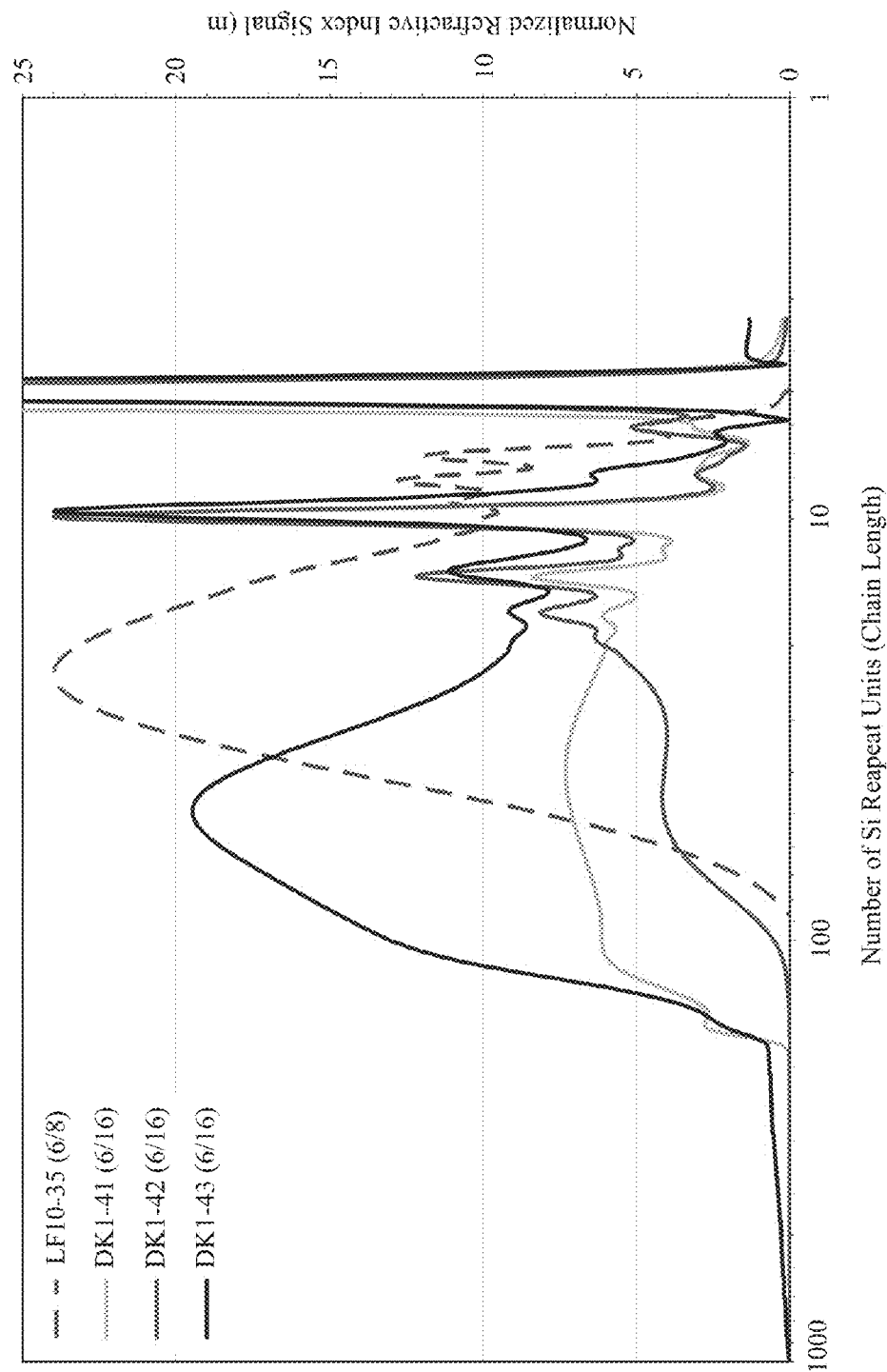
FIG. 9 shows GPC data on polycyclopentasilanes made by oligo- and/or polymerization using various Rh catalysts containing phosphine-based ligands in accordance with embodiments of the present invention.

Generally, polysilanes prepared according to the present method have a broader molecular weight distribution than polysilanes prepared from $PhSiH_3$, the corresponding GPC data for which is shown by the dashed line in FIG. 9. It is believed that a broader molecular weight distribution may, in some cases, facilitate printing an ink containing such a polysilane mixture. Following evaporative work-up to remove some, most or substantially all of the relatively volatile components (e.g., monomer; see "An Exemplary Method of Removing Low-Molecular Weight Silanes from Oligo-/Polysilane Mixtures" below), in some cases (e.g., the catalysts employing bidentate ligands), the present method may provide a polysilane mixture having a greater average molecular weight (which may be a weight or number average molecular weight, and/or which can be reflected in the average number of silicon atoms in the polysilane chains) than the comparative polysilanes prepared from $PhSiH_3$.

Figure 10:
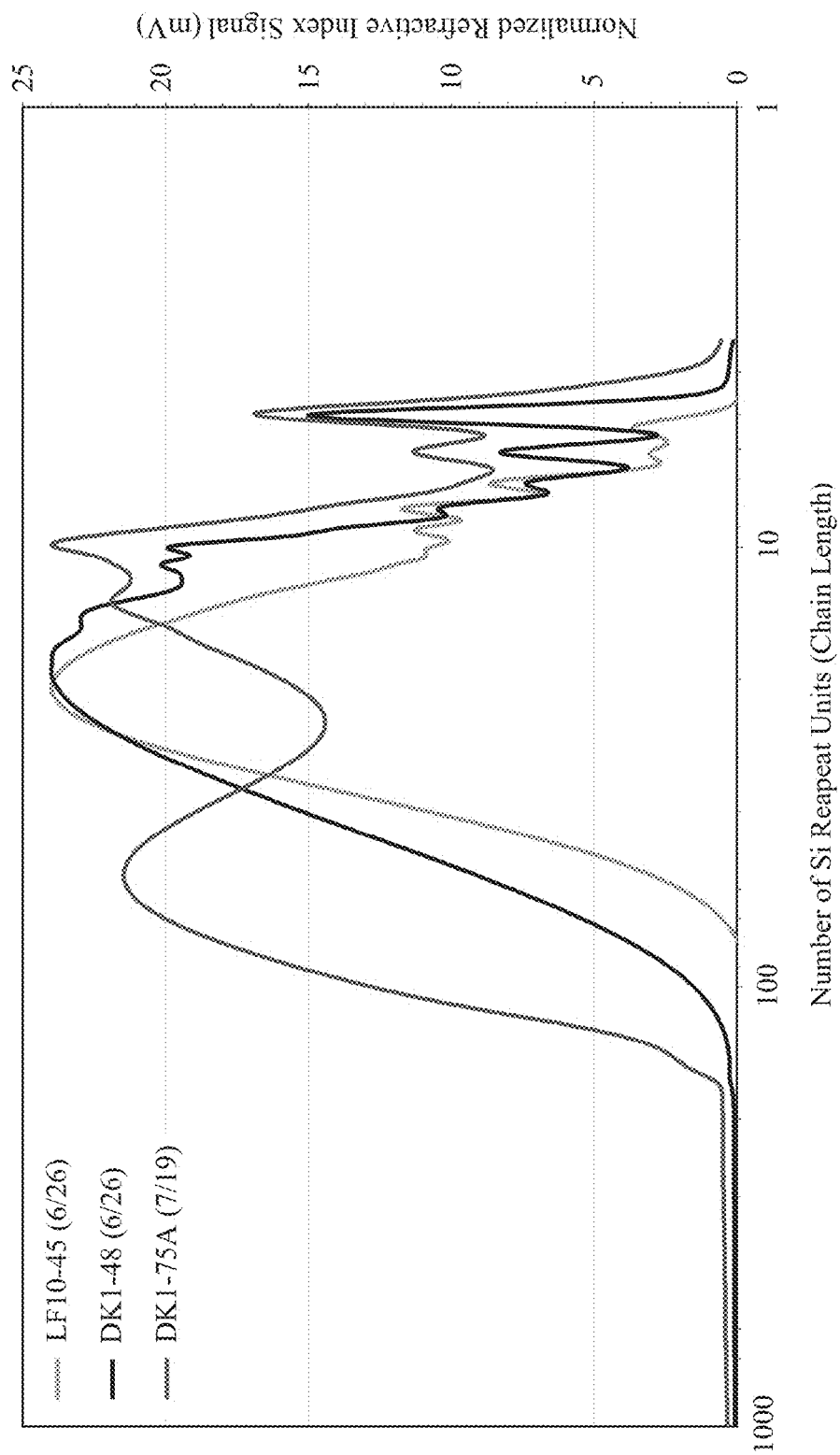
FIG. 10 shows GPC data on polycyclopentasilanes made by oligo- and/or polymerization using a Rh catalyst containing a bidentate amine ligand in accordance with an embodiment of the present invention.

In a variation of the typical process, FIG. 10 shows GPC data for various polycyclopentasilanes made by oligo-/polymerization using various Rh catalysts containing a bidentate amine ligand. As for the oligo-/polysilane mixtures of FIG. 9, the oligo-/polysilane mixtures of FIG. 10 also generally show a broader molecular weight distribution than polysilanes prepared from $PhSiH_3$ (see the trace labeled "baseline" in FIG. 10). Also, following evaporative work-up, the oligo-/polysilane mixtures of FIG. 10 may also provide a polysilane mixture having a greater average molecular weight than the comparative polysilanes prepared from $PhSiH_3$.

Figure 11:
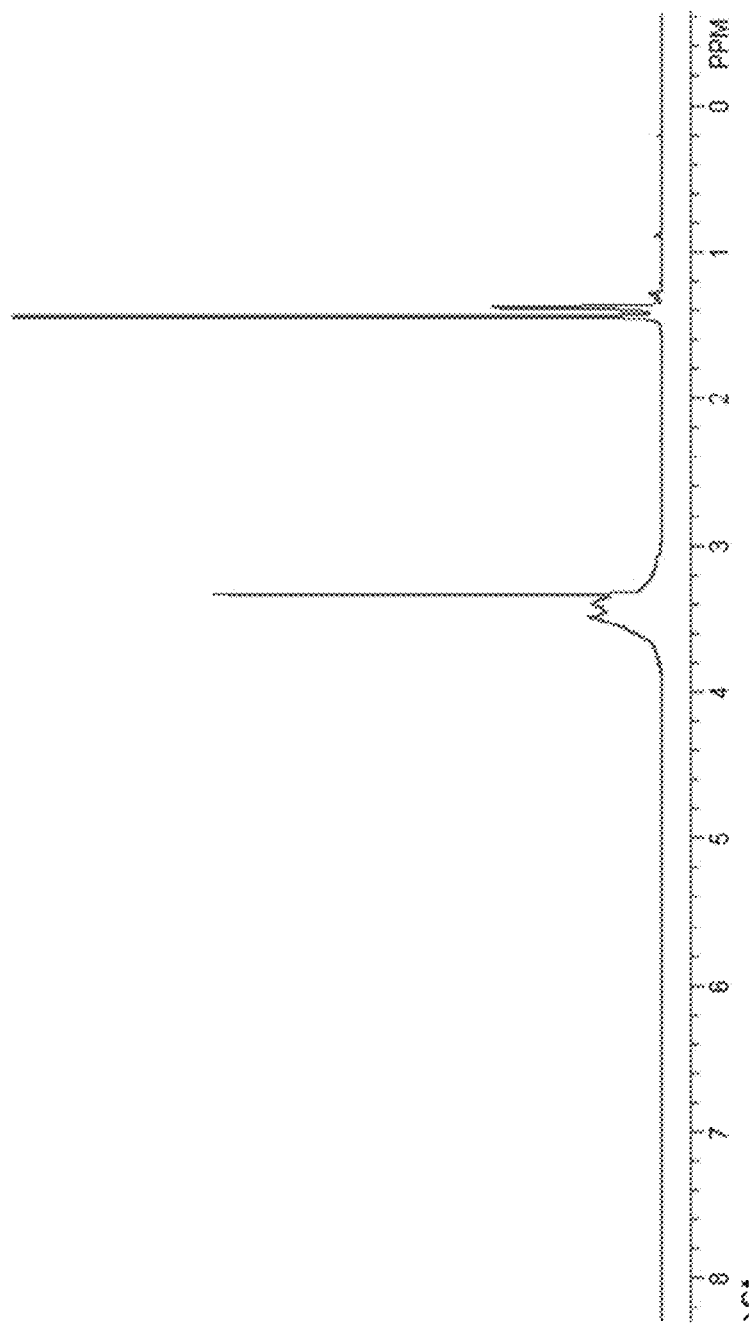
FIG. 11 shows proton NMR data on a polycyclopentasilane made by oligo- and/or polymerization using a Rh catalyst containing a bidentate phosphine ligand in accordance with an embodiment of the present invention.

The polymeric products of the invention have been analyzed by NMR and GPC, demonstrating the formation of poly-/oligomeric (cyclo)pentasilane materials (as shown in FIGS. 10-12). For example, FIG. 11 shows the $^1H$ NMR spectrum of an oligo-/poly(cyclopentasilane) mixture made by a typical process using (PP)RhCl as the catalyst (see FIG. 8). For the polysilane in FIG. 10, the catalyst was precipitated from the reaction mixture by adding hexane, and the precipitated catalyst was removed by filtration through Florisil®.

The $^1$H NMR spectrum shows Si-H shift values between 3-4 ppm, typical and/or comparable to shift values of other hydrosilanes, such as the relatively intense, narrow peak from the unreacted cyclopentasilane monomer. (The peaks at about 1.4 ppm correspond to hexane, cyclohexane and deuterated cyclohexane.) A $^{31}$P NMR spectrum of a polysilane mixture prepared by the same process showed substantially no significant phosphorous-containing residues, either from the catalyst or from free phosphine.

Variations of reaction conditions, such as the selection of catalyst type and ligand, reaction time (from 1 sec to 1 week for either liquid- or gas-phase coupling; e.g., 1-24 hours, and preferably 2-8 hours in liquid-phase coupling/polymerization), and temperatures above ambient (from 25 to 85° C.), and below ambient (−78° C. to 15° C.) may be used. Preferably, the reaction temperature is ambient (generally, no additional/external heating or cooling; e.g., from 15 to 25° C.). Variations of other reaction conditions, such as pressure (e.g., for gas-phase silane starting materials, from 1, 5 or 10 atm, up to 15, 20 or 30 atm), catalyst loading (0.01 to 1000 transition metal atoms to 100 silicon atoms, more preferably 0.1 to 10 transition metal atoms to 100 silicon atoms), and solvent can control the production of long-chain poly-/oligomers of (cyclo)silanes with respect to a higher weight-average and/or number-average molecular weight (a higher average number of silicon atoms).

In other embodiments, hydrogen gas generated during the reaction is continuously removed with an argon stream or via a dynamic vacuum, or by increasing the liquid-gas phase interface area to promote an increased hydrogen removal rate (e.g., using a reaction vessel with a flat surface). Also, in some cases, fresh catalyst may be advantageously added after completion of an initial reaction period (e.g., from about 1 sec, 1 min, or 1 h. to about 50% of the total reaction time) to continue consuming monomer. Unreacted monomer may be removed and recycled (e.g., by washing the reaction mixture with tetramethylsilane or by distilling off the monomer under vacuum). In the case of tetramethylsilane washing, the tetramethylsilane phase may be separated using a reparatory funnel, and the starting silane recovered by evaporation of the tetramethylsilane solvent.

In all cases, the catalyst from the reaction mixture may be recycled, reconditioned if necessary or desired, and reused (in part or in total) in one or more subsequent reactions. Moreover, it is possible to remove and/or recover the unreacted monomer (such as cyclopentasilane or other monomer that is liquid at ambient temperature) from the reaction mixture by evaporation or washing with tetramethylsilane, and use (or recycle) it in subsequent reactions.

Removing the catalyst from the poly(aryl)silane reaction product in general involves contacting the polysilane reaction product with an adsorbent. Suitable adsorbents include chromatography gels, or finely divided silicon oxide and/or aluminum oxide, that are substantially unreactive with the poly(aryl)silane. Alternatively, the catalyst may be removed from the poly(aryl)silane product by adding a solvent in which the poly(aryl)silane is soluble and the catalyst is insoluble, to precipitate the catalyst, then filtering the precipitated catalyst. A suitable solvent for removing catalysts of the invention from the reaction products is hexane.

In addition to or instead of filtration through an adsorbent such as Florisil or Celite, the catalyst may be removed with a metal-scavenging column containing immobilized ligand functionalities such as thiol and/or thiourea groups. In an alternative embodiment, the catalyst may be supported on a stationary gel or polymer phase such as silica, alumina or polystyrene beads, so as to facilitate isolation of the polyhydrosilane products and/or recovery of the catalyst. Thus, the catalyst may be immobilized on and/or anchored to a substrate, and removing such a catalyst from the product (e.g., poly(aryl)silane) may comprise filtering the immobilized and/or anchored catalyst and/or decanting the poly(aryl)silane. Alternatively, removing the catalyst from the poly(aryl) silane may comprise solid phase extraction of the catalyst using a column having thiol or thiourea groups thereon. In one further alternative embodiment, removing the catalyst from a poly(aryl)silane comprises extracting the catalyst from an organic phase comprising the poly(aryl)silane with a water-soluble thiol in an aqueous phase.

Other reaction conditions, such as solvent, dopant species, and characterization method or technique may be used, varied and/or optimized as described above for the heterogeneous catalysis method.

An Exemplary Method of Removing Low-Molecular Weight Silanes from Oligo-/Polysilane Mixtures A typical reaction workup for a crude reaction mixture of polysilane includes dilution with cyclohexane, followed by filtration and gentle drying (e.g., with relatively low vacuum, such as house vacuum; for example, greater than 10, 20, or 30 Torr, or any value therein), preferably in a drybox (glove box). However, such relatively low vacuum does not necessarily remove the residual monomer. In the typical polymerization of cyclopentasilane as described above, ~20% of the reaction mixture remains, and the polymeric material (formulated as a 20% solution by weight in cis-decalin) may not provide ideal properties for inkjet printing. Instead of forming silicon islands (see, e.g., in U.S. patent application Ser. Nos. 10/616, 147, 11/452,108, 11/818,078 and 11/888,949, filed on Jul. 8, 2003, Jun. 12, 2006, Jun. 12, 2007, and Aug. 3, 2007 respectively, the relevant portions of which are incorporated herein by reference), the material may form beads, or "ball up," on the substrate.

It is thought that residual silane starting material may interfere with the printing process, perhaps by reducing the viscosity of the ink and/or increasing the surface tension of the ink to a value that leads to increased bead formation. Thus, excess silane can be removed by drying under high vacuum (e.g., ≤1 Torr, 500 mTorr, 200 mTorr, 50 mTorr or any value therein, down to a value that also significantly decreases the amount of oligomers having 10 or more Si atoms, such as 1, 2, or 5 mTorr) for about 2 hours or more. In one example, such high vacuum can be provided by a conventional Schlenk line. In this manner, the amount of cyclopentasilane left in the reaction mixture can be reduced to less than 10%, 8%, or 5% (e.g., by weight). An ink including the resulting material, for example formulated as a cis-decalin solution, is printable on wafers. The wafer has a contact angle with the ink in a range of from 0 to 15°. Such a range of contact angles enables a wide process window for printing, and thus, promotes reproducible silicon island formation. However, depending on the specific printing surface and its surface energy, a composition containing more than 10% by weight of volatile silanes may be preferable. Alternatively, a minimum amount of silane monomer (e.g., cyclopentasilane or low-molecular weight oligosilane may be helpful for solubility of the higher molecular weight polysilanes in the composition. For example, at least 5 wt %, 10 wt %, 15 wt %, etc. (or any minimum value therein) of (cyclo)silane having 15 silicon atoms or less (e.g., 10 Si atoms, 7 Si atoms, 5 Si atoms, or Ge atoms if a Ge-containing monomer is used) may remain in the product mixture.

Other embodiments for the workup method include drying the oligo-/polysilane for a longer period of time, such as for 12, 16, 24, 48 hours or more. Further, drying under vacuum can be assisted by gentle heating (e.g., at 30-40° C., which can be performed using a Schlenk tube containing the material). These approaches may remove silane monomer substantially completely. However, merely reducing silane content (e.g., when the silane monomer contains 7 or fewer silicon atoms) appears to be sufficient for improving the printability (e.g., for inkjetting) of the oligo-/polysilane. For example, in one embodiment, excess cyclopentasilane is removed by drying under a vacuum of <50 mTorr for 2 - 24 hours, whereby the amount of cyclopentasilane left in the reaction mixture is reduced to less than 10% by weight. In other embodiments, the excess monomer and/or volatile oligosilanes can be removed by applying milder vacuum conditions (i.e. >1 Torr) in combination with passing an inert gas stream over the mixture. This approach may result in better control of the polysilane composition (e.g., the ratio between volatile oligosilanes [i.e., having 10 Si units or less] and polysilanes).

Exemplary Oligo-/Polysilanes

Another aspect of the invention includes oligo- and/or polysilanes ("oligo-/poly-silanes") having an atomic purity of greater than 90% with respect to silicon, germanium and hydrogen (i.e., greater than 90% of the atoms in the polysilane are either Si or H). In particular, the present oligo-/polysilanes may have an atomic purity of at least 95%, at least 99%, or any value therein, with respect to silicon, germanium and hydrogen. In one embodiment in which the oligo-/polysilane is made from silane monomers of the formula $Si_nH_{2n+2}$ and/or cyclo-$Si_mH_{2m}$, the oligo-/polysilane has an atomic purity of greater than 90% with respect to silicon and hydrogen (i.e., greater than 90% of the atoms in the polysilane are either Si or H). Preferably, such oligo-/polysilanes have an atomic purity of at least 95%, at least 99%, or any value therein, with respect to silicon and hydrogen. In a particularly preferred embodiment, the purity is at least 99.9% with respect to Si and H.

A preferred oligosilane and/or polysilane composition consists essentially of (i) hydrogen and (ii) silicon and/or germanium, and has a molecular weight of from 450 to about 2300 g/mol, which, after coating and/or printing the composition (optionally with simultaneous or immediately subsequent UV irradiation) and forming a oligo- or polysilane film, then curing, forms an amorphous, hydrogenated semiconductor film having a carbon content of not greater than 0.1 at %. In alternative embodiments, the oligosilane or polysilane may have a chain length of from 10 to 10,000, 100,000 or 1,000,000 silicon and/or germanium atoms. In further embodiments, the molecular weight (which may be a molecular weight distribution or an average molecular weight) is from about 500 to about 1500 g/mol, preferably from about 500 to about 1300 g/mol. In further embodiments, the chain length (which may be a chain length distribution or an average chain length) is from about 15 to about 1000 silicon and/or germanium units, preferably from about 15 to about 100 silicon and/or germanium units. For example, the composition may include or consist essentially of a mixture of oligosilanes and/or polysilanes, each oligosilane or polysilane therein consisting essentially of (i) hydrogen and (ii) silicon and/or germanium, and having the prescribed molecular weight and/or chain length.

Another composition of oligo-/polysilanes consists essentially of (i) hydrogen and (ii) silicon and/or germanium, has a molecular weight of from 450 to about 2300 g/mol, and has a polydispersity index of <2.5, preferably <4. This latter composition may further have any demonstrable or theoretically possible polydispersity index <2.5 or higher.

In one embodiment, at least 50 mol % of the composition consists of the oligo-/polysilane. In further embodiments, at least 65 mol %, 70 mol %, 75 mol %, or 80 mol % (or any value therein or thereabove) of the composition consists of the oligo-/polysilane.

The present oligo-/polysilane composition is noteworthy for its capability to form printed thin semiconductor films with very high purity levels. Thus, in some embodiments of the present composition, the carbon content of the thin semiconductor film(s) is not greater than 0.05 at %. Preferably, the carbon content (as well as the content of other impurity atoms) is determined by SIMS analysis. In further embodiments, the film made from the oligo-/polysilane composition has a transition metal content of not greater than 0.1 parts per million, preferably not greater than 0.05 parts per million, more preferably not greater than 0.02 parts per million. In still further embodiments, the film made from the oligo-/polysilane composition has an oxygen content is <0.05 at % and/or a nitrogen content of not greater than 100 parts per million.

In another aspect of the invention, the present oligo-/polysilane may have the formula H-RAHR)$_p$(c-$A_mR^1_{2m-2}$)d-H, where each instance of A is independently Si or Ge; each instance of R and $R^1$ is independently H, -$A_bH_{b+1}R^2_b$ (where $R^2$ is H or aryl), or aryl, but if q=0 and A is Si, R is not phenyl; (p+b)≥10 if q=0, q≥2 if p=0, and (p+q)≥2 if both p and q≠0; and each instance of m is independently from 4 to 6. Alternatively, the present oligo-/polysilane may have the formula H-[($A_nH_{2n}$)$_p$(c-$A_mR^1_{2m-2}$)$_q$]-H or H-[$A_nH_nR_n$)$_p$(c-$A_mR^1_{2m-2}$)]-H, where A, n, p, m, q, R and $R^1$ are as described herein. In various embodiments, A is Si, n is an integer of from 3 to 7, R is H, phenyl or tolyl (preferably H or phenyl, more preferably H), and $R^1$ is H. In other embodiments (which may be combined with one or more other embodiments), at least one A is Ge, and/or p or q=0. In the latter embodiment, when q=0, p is at least 2, 3, 4 or more, and p can be up to 20, 25, 30 or more; and when p=0, q is at least 2, 3, 4 or more, and q can be up to 20, 25, 30 or more.

One oligo-/polysilane has the formula H-(AHR)$_n$-H. In certain embodiments, when R=-$A_bH_{2b+1}$, n*(b+1) has an average value of ≤1000 (e.g., ≤200, ≤100, ≤50 or any value <1000) according to or as calculated from a number average molecular weight Mn of the polysilane. In another embodiment, the polysilane has the formula H-(c-$A_mH_{2m-2}$)$_q$-H, where each instance of m is independently 5 or 6, and q is from 2 to 30 (preferably 4 to 30, or any range of values therein). In further embodiments, the present polysilane contains up to 1000 or 10,000, 100,000 or 1,000,000 A units.

Exemplary Inks Including Oligo-/Polysilanes

In general, one composition contains an oligosilane and/or polysilane (as described herein) and a solvent in which the oligosilane and/or polysilane is soluble. The solvent may include any of a wide variety of solvents, such as those described in U.S. patent application Ser. Nos. 10/616,147, 10/789,317, 10/950,373, 10/949,013, 10/956,714, 11/246,014 and 11/249,167, respectively filed on Jul. 8, 2003, Feb. 27, 2004, Sep. 24, 2004, Sep. 24, 2004, Oct. 1, 2004, Oct. 6, 2005 and Oct. 11, 2005, the relevant portions of which are incorporated herein by reference. However, for reasons relating to ease and/or completeness of removal, properties facilitating spincoating and printing, and compositional stability, preferred solvents include linear alkanes, cycloalkanes, polycycloalkanes, and mixtures thereof. For example, the solvent may be a linear ($C_3$-$C_{12}$) alkane (e.g., pentane, hexane, heptane, octane, decane), a ($C_5$-$C_{10}$) cycloalkane (e.g., cyclopentane, cyclohexane, cyclooctane), a ($C_8$-$C_{14}$) polycyclo-alkane, or a mixture thereof. Polycycloalkanes include cis- and trans-bicycloalkanes, such as cis-decalin, trans-decalin, and mixtures thereof The composition may contain the oligosilane and/or polysilane in an amount of from about 0.5 to about 50% by weight or by volume (e.g., from about 1 to about 30% or about 5 to about 25% by weight or by volume, or any range of values between 0.5 and 50%). Furthermore, to improve the purity of a semiconductor thin film produced from the composition, the ink composition preferably consists essentially of the oligo-/polysilane and the solvent.

In another preferred embodiment, the oligo-/polysilane component of the present ink composition contains <10% by weight of monomer (or of silanes having ≤10, 8, 7 or 5 silicon atoms, optionally depending on the identity of the monomer).

An Exemplary Method of Making Silicon-Containing Thin Films

A general method of forming a semiconductor film from a low-carbon composition of the invention includes coating or printing the composition onto a substrate; heating the coated or printed composition sufficiently to form an amorphous, hydrogenated semiconductor; and optionally annealing and/or irradiating the amorphous, hydrogenated semiconductor sufficiently to at least partially crystallize and/or reduce a hydrogen content of the amorphous, hydrogenated semiconductor and form the semiconductor film. The method may include irradiating the composition with UV radiation, simultaneously with or immediately subsequent to coating or printing the composition onto a substrate, substantially as disclosed in U.S. patent application Ser. Nos. 10/789,274, 10/950,373, 10/949,013, 10/956,714, 11/246,014, 11/249,167, 11/452,108, 11/818,078 and 11/888,949, respectively filed on Feb. 27, 2004, Sep. 24, 2004, Sep. 24, 2004, Oct. 1, 2004, Oct. 6, 2005, Oct. 11, 2005, Jun. 12, 2006, Jun. 12, 2007, and Aug. 3, 2007, the relevant portions of which are incorporated herein by reference. Thus, in various embodiments of the present method, the coating step and the irradiating step may be conducted simultaneously for a length of time of from 1 to 300 seconds, from 3 to 180 seconds, or from 5 to 120 seconds.

Spin coating may be conducted at a speed of from 100 to 20,000 revolutions per minute (RPM). In a preferred embodiment, the spin coating is conducted in two stages. Thus, spin coating may comprise (i) a first spin coating stage conducted at a first speed, and (ii) a second spin coating stage conducted at a second speed greater than the first speed. In various implementations, the first speed may be from 100 to 2,000 RPM, from 200 to 1,500 RPM, or from 300 to 1,000 RPM, and the second speed may be from 1,000 to 20,000 RPM, from 1,500 to 15,000 RPM, or from about 2,000 to 10,000 RPM. Of course, one may select any endpoint for the first and/or second speeds from any of these ranges or from within any of these ranges, as long as the second speed is greater than the first speed. For example, the first speed may be from 100 to 1,000 RPM, and the second speed may be from 1,500 to 10,000 RPM. In one such implementation, the first speed is about 500 RPM and the second speed is about 2,000 RPM. In this embodiment, the second speed is usually greater than the first speed by an amount of 2× or more, 3× or more, or 4× or more.

Similarly, the irradiating step may be conducted for a length of time, for example, of from 3 to 600 seconds, from 5 to 300 seconds, or from 10 to 150 seconds. As for spin coating, one may select any endpoint for any applicable length of irradiating time from any of these ranges, or from within any of these ranges. Generally, however, (spin) coating is performed for a greater length of time than irradiating. In one implementation, the (spin) coating and irradiating steps are stopped at about the same time (approximately simultaneously).

The curing step generally comprises heating the composition and/or layer to a temperature of at least about 200° C. (preferably at least about 300° C., and more preferably at least about 350° C.), generally for a length of time sufficient to cure and/or anneal the composition. Such heating may be conducted for a length of time of at least 1 minute, 3 minutes or 5 minutes. While the maximum heating time may be about 30 minutes, 45 minutes or 1 hour in a typical embodiment, TFT quality silicon films can be obtained after heating at about 300° C. (or more) for several hours (e.g., from 2, 3 or 4 hours to 12, 8 or 6 hours). In one embodiment, curing comprises heating the substrate and the layer to a temperature of from about 400° C. to about 500° C., generally for a length of time of about 20 minutes. In one embodiment, curing further comprises heating the composition and/or layer to a temperature of from about 100° C. to about 200° C. to further (i) remove any remaining solvent and/or (ii) oligomerize and/or polymerize the silane, prior to curing and/or annealing the composition as described in this paragraph. In one implementation, such heating (to remove solvent and/or to oligomerize and/or polymerize the silane) is conducted by placing the substrate on a hot plate under an inert atmosphere, although one could also use a conventional oven or furnace in which the atmosphere can be controlled for such heating. Alternatively, curing may comprise conventional electron beam curing of the polysilane film.

The composition may further include one or more dopants. The dopants are generally compounds containing one or more dopant atoms, for example selected from the group consisting of B, Al, Ga, P, As and Sb. For example, the dopant compounds may be selected from those disclosed in the preceding paragraph. However, in preferred embodiments, the dopant compounds consist essentially of the dopant atom(s), silicon and/or germanium atoms, and hydrogen and/or t-butyl (-C[CH$_3$]$_3$) groups. Therefore, preferred dopants may have the formula cyclo-(AH$_z$)$_n$(DR$^1$)$_m$ (where n is from 2 to 12, m is 1 or 2, each of the n instances of z is independently 1 or 2, and each of the m instances of R$^1$ is alkyl [e.g., t-butyl], aryl, aralkyl, or AR$^2_3$, where R$^2$ is hydrogen or A$_y$H$_{2y+1}$ [e.g., 1≤y≤4], such as SiH$_3$ and Si(SiH$_3$)$_3$), (A$_n$H$_{z'}$)$_m$(DR$^1_{3-m}$)$_q$ (where n is from 3 to 12, z' is from (n−q) to (2n+2−q), m is from 1 to 3, q is from 1 to n [preferably 1 or 2], and each of the (3−m) instances of R$^1$ is independently H, alkyl [e.g., t-butyl], or AR$^2_3$), (AH$_p$)$_.$(DR$^1_2$)$_2$ (where n is from 3 to 12, each of the n instances of p is independently 1 or 2, and each R$^1$ is independently H, alkyl [e.g., t-butyl], or AR$^2_3$), D$_a$R$^1_b$ (where a is from 1 to 20, each of the b instances of R$^1$ is independently H, alkyl [e.g., t-butyl], or AR$^2_3$, at least one of the b instances of R$^1$ is alkyl or AR$^2_3$, and b is an integer corresponding to the number of binding sites available on the a instances of D), (R$^2_3$A)$_r$A$_c$(DR$^1_2$)$_s$ (where c is 1 to 4, r+s=2c+2, s≥1 [preferably s≥3], and R$^1$ and R$^2$ are as described for D$_a$R$^1_b$), or (as described above) D(A$_x$H$_{2x+1}$)$_3$ or AH$_y$(DH$_2$)$_z$, where D is selected from the group consisting of B, Al, Ga, P, As and Sb (preferably B, P, As and Sb), and A is Si or Ge.

Silicon-Containing Thin Films

A semiconductor film may be formed from compositions of the invention by: coating or printing the composition onto a substrate; heating the coated or printed composition sufficiently to form an amorphous, hydrogenated semiconductor; and optionally annealing and/or irradiating the amorphous, hydrogenated semiconductor sufficiently to at least partially crystallize and/or reduce a hydrogen content of the amorphous, hydrogenated semiconductor and form the semiconductor film. This method may include irradiating the composition with UV radiation, simultaneously with or immediately subsequent to coating or printing the composition onto the substrate. The composition may further comprise one or more dopants.

A preferred thin film in accordance with the invention consists essentially of hydrogen and silicon. Another thin film consists essentially of hydrogen, silicon and germanium. In preferred embodiments, the carbon content of the thin film is not greater than 0.05 at % as determined by SIMS analysis. Preferred films made from the present polysilane compositions have a transition metal content of not greater than 0.1 parts per million, in particular where the film has a transition metal content of not greater than 0.05 parts per million, not greater than 0.02 parts per million, or any value therein or therebelow. Also, the film may have an oxygen content of not greater than 0.1 at %. In particular, the oxygen content may be <0.05 at %. The film may have a nitrogen content of not greater than 100 parts per million.

The above semiconductor film methods may be employed to make a thin film transistor, capacitor, diode and/or resistor device and/or a circuit comprising such a device, e.g., an EAS (electronic article surveillance) or RFID (radio frequency identification) tag, display backplane, sensor and/or photovoltaic device or circuit. Thus, the invention includes a film transistor, capacitor, diode and/or resistor device and/or circuit, comprising the semiconductor film as described herein and/or made using the materials and/or methods described herein. The invention also further relates to and includes a method of making an EAS or RFID tag, display backplane, sensor and/or photovoltaic device or circuit, comprising forming a semiconductor thin film for a transistor, capacitor, diode and/or resistor device in such a tag, backplane, sensor, device and/or circuit.

EXAMPLE 1

Synthesis of Poly(cyclopentasilane) by Heterogeneous Catalysis

Neat cyclopentasilane (1.0 g) was added to a 4 mL amber vial containing 1 mol % Rh black (6.9 mg) under an inert atmosphere, and this reaction mixture was allowed to stir for 2 h in the loosely capped vial. Then, the reaction was quenched with 2 g of distilled cyclohexane, and the resulting mixture transferred to a 40 mL amber vial (equipped with a stir bar) and further diluted with 5 g of cyclohexane. After 30 min of stirring, insoluble materials were allowed to settle for about 15 min, and the mixture then filtered through a short plug of Celite (primed with distilled cyclohexane), ensuring that the black Rh particles stayed on top of the filter bed. The solution was then transferred to a Schlenk tube and the volatile materials removed by applying high vacuum (<~300 mTorr) for about 2 h. This drying step should reduce the cyclopentasilane (monomer) content in the resulting product to <10% (monomer content can be checked by GPC). If the cyclopentasilane content exceeds 10% of the reaction mixture, the solution should be further dried under vacuum. The overall procedure typically yields 0.6-0.7 g of poly(cyclopentasilane) (60-70% yield), although higher yields have been obtained. The product material can be stored as a 20 wt % solution in dried, distilled cis-decalin.

FIG. 12 shows data from SIMS analysis of three different films identically prepared from an ink containing about 15 wt % of each of three different poly(cyclopentasilane) mixtures in the same cycloalkane solvent. The films were prepared identically, in accordance with the UV-spincoating and curing procedures described in U.S. patent application Ser. No. 10/789,274, filed on Feb. 27, 2004. The impurity levels are remarkably similar across all three examples. In each case, the carbon content and the oxygen content are each less than 0.05 at %, a level suitable for semiconductor-grade films. Nitrogen impurities are at a level of about 10 ppm or less, and typical metal impurities (e.g., Na, K, Al, Mg) are less than 0.01 ppm. Even the level of catalyst metal (Rh) in the film is remarkably low (<0.02 ppm; see the third row of SIMS data in FIG. 12).

EXAMPLE 2

Synthesis of Polysilane Mixtures by Heterogeneous Catalysis

Polymerization reactions similar to Example 2 above were conducted using (1) cyclopentasilane with Ru black as the catalyst and (2) linear heptasilane as the monomer, with Rh black as the catalyst. Using the polymerization of cyclopentasilane by 1 mol % Rh black as the baseline reaction, the method can provide polymeric materials in the MW range of 700-1300 (or 20-45 Si units, as determined by Gel Permeation Chromatography), with the MW increasing at longer reaction times. Furthermore, formation of polymeric products was confirmed by $^1$H and $^{29}$Si NMR spectroscopy. The purified polymer is then mixed with distilled, degassed cyclohexane, and the solution stored in a freezer at a temperature below the melting point of cyclohexane until use, at which time the frozen cyclohexane is removed by vacuum. Printability of inks containing polyhydrosilanes produced by the present process has been established.

The foregoing descriptions of specific embodiments of the present invention have been presented for purposes of illustration and description. They are not intended to be exhaustive or to limit the invention to the precise forms disclosed, and obviously many modifications and variations are possible in light of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A composition comprising one or more compounds consisting essentially of (i) hydrogen and (ii) silicon and/or germanium, wherein at least 75 mol % of all of the compounds consisting essentially of (i) hydrogen and (ii) silicon and/or germanium have a molecular weight in a distribution of from 450 to about 3300 g/mol.

2. The composition of claim 1, wherein said compound(s) consist essentially of hydrogen and silicon.

3. A formulation, comprising:
   a) composition of claim 1; and
   b) a solvent in which the compound(s) are soluble.

4. The formulation of claim 3, wherein coating and/or printing the formulation (optionally with simultaneous or immediately subsequent UV irradiation) and curing forms a film having a carbon content of not greater than 0.1 at %.

5. A method of forming a silicon- and/or germanium-containing film from the formulation of claim 3, comprising:
   a) coating or printing said formulation onto a substrate, optionally with simultaneous or immediately subsequent UV irradiation; and
   b) heating (and optionally further annealing and/or irradiating) said coated or printed formulation sufficiently to form said silicon- and/or germanium-containing film.

6. A method of making a thin film transistor, capacitor, diode and/or resistor device and/or circuit, comprising making a semiconductor film therein by the method of claim 5, then forming a conductor thereon.

7. A thin film transistor, capacitor, diode, resistor device, circuit, RFID tag, display backplane, sensor and/or photovoltaic device, comprising the semiconductor film made by the method of claim 6.

8. A method of forming a silicon oxide film from the formulation of 3, comprising:
   forming a thin film from the formulation, wherein said compound(s) consist essentially of hydrogen and silicon; and
   drying, curing and/or annealing the thin film and oxidizing the thin film to form the silicon oxide film.

9. The composition of claim 1, wherein the distribution is from 700 to about 2300 g/mol.

10. The composition of claim 1, wherein at least 5 wt% of all of the compounds consisting essentially of (i) hydrogen and (ii) silicon and/or germanium have 10 or less Si and/or Ge atoms.

11. A composition comprising one or more compounds consisting essentially of (i) hydrogen and (ii) silicon and/or germanium, wherein at least 50 mol % of all of the compounds consisting essentially of (i) hydrogen and (ii) silicon and/or germanium have a molecular weight in a distribution of from 700 to about 2300 g/mol.

12. A composition comprising one or more compounds consisting essentially of (i) hydrogen and (ii) silicon and/or germanium, wherein at least 75 mol % of all of the compounds consisting essentially of (i) hydrogen and (ii) silicon and/or germanium have a chain length from 15 to about 1,000,000 Si and/or Ge units.

13. The composition of claim 12, wherein the chain length at least 80 mol % of all of the compound(s) is from 15 to about 1,000 Si and/or Ge units.

14. The composition of claim 12, wherein said compound(s) consist essentially of hydrogen and silicon.

15. A formulation, comprising:
   a) composition of claim 12; and
   b) a solvent in which the compounds are soluble.

16. The formulation of claim 15, wherein coating and/or printing the formulation (optionally with simultaneous or immediately subsequent UV irradiation) and curing forms a film having a carbon content of not greater than 0.1 at %.

17. A method of forming a silicon- and/or germanium-containing film from the formulation of claim 15, comprising:
   a) coating or printing said formulation onto a substrate, optionally with simultaneous or immediately subsequent UV irradiation; and
   b) heating (and optionally further annealing and/or irradiating) said coated or printed formulation sufficiently to form said silicon- and/or germanium-containing film.

18. A method of making a thin film transistor, capacitor, diode and/or resistor device and/or circuit, comprising making a semiconductor film therein by the method of claim 17, then forming a conductor thereon.

19. A thin film transistor, capacitor, diode, resistor device, circuit, RFID tag, display backplane, sensor and/or photovoltaic device, comprising the semiconductor film made by the method of claim 18.

20. A method of forming a silicon oxide film from the formulation of 15, comprising:
   forming a thin film from the formulation, wherein said compound(s) consist essentially of hydrogen and silicon; and
   drying, curing and/or annealing the thin film and oxidizing the thin film to form the silicon oxide film.

21. The composition of claim 12, wherein at least 5 wt% of all of the compounds consisting essentially of (i) hydrogen and (ii) silicon and/or germanium have 10 or less Si and/or Ge atoms.

22. A composition comprising one or more compounds consisting essentially of (i) hydrogen and (ii) silicon and/or germanium, wherein 65 mol% of all of the compounds consisting essentially of (i) hydrogen and (ii) silicon and/or germanium have a molecular weight in a distribution of from 700 to about 2300 g/mol.

\* \* \* \* \*